(12) United States Patent
Okahisa et al.

(10) Patent No.: US 11,531,179 B2
(45) Date of Patent: *Dec. 20, 2022

(54) LENS, LIGHT EMITTING DEVICE AND METHOD OF MANUFACTURING THE LENS AND THE LIGHT EMITTING DEVICE

(71) Applicant: NICHIA CORPORATION, Anan (JP)

(72) Inventors: Tsuyoshi Okahisa, Tokushima (JP); Toshiyuki Fujii, Anan (JP); Tomohisa Kishimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/558,276

(22) Filed: Sep. 2, 2019

(65) Prior Publication Data
US 2020/0073075 A1    Mar. 5, 2020

(30) Foreign Application Priority Data
Aug. 31, 2018  (JP) .............................. JP2018-162679

(51) Int. Cl.
| | | |
|---|---|---|
| *F21V 5/00* | (2018.01) | |
| *G02B 7/02* | (2021.01) | |
| *B29D 11/00* | (2006.01) | |
| *H01L 33/58* | (2010.01) | |

(Continued)

(52) U.S. Cl.
CPC .......... *G02B 7/02* (2013.01); *B29D 11/00269* (2013.01); *G02B 7/003* (2013.01); *H01L 33/58* (2013.01); *H01L 33/483* (2013.01); *H01L 2933/0025* (2013.01)

(58) Field of Classification Search
CPC .... G02B 7/02; G02B 7/003; B29D 11/00269; B29D 11/00307; H01L 33/58; H01L 33/483; H01L 2933/0025; H01L 33/44; H01L 33/46; H01L 2933/0058; H01L 2924/181; H01L 33/52; H01L 33/56; B29C 45/37; B29C 45/16; B29C 2793/009; B29C 45/0055; F21Y 2115/10; F21S 43/14

See application file for complete search history.

(56) References Cited

U.S. PATENT DOCUMENTS

| | | | | |
|---|---|---|---|---|
| 5,101,327 A | * | 3/1992 | Jewett ................... | F01M 11/12 |
| | | | | 362/120 |
| 2005/0265019 A1 | * | 12/2005 | Sommers .............. | F21V 29/717 |
| | | | | 362/217.16 |

(Continued)

FOREIGN PATENT DOCUMENTS

| | | | |
|---|---|---|---|
| CN | 102856478 A | * | 1/2013 |
| CN | 204678257 U | | 9/2015 |

(Continued)

*Primary Examiner* — Omar Rojas Cadima
(74) *Attorney, Agent, or Firm* — Mori & Ward, LLP

(57) ABSTRACT

A lens includes a cover part and a light-shielding part. The cover part includes a lens part, a connection part, and a plurality of flange parts, formed with a thermosetting first resin and continuous to one another. The light-shielding part covers lateral end surfaces and an upper surface of each of the flange parts and outer lateral sides of the connection part and formed with a thermosetting second resin having a greater light-absorptance or a greater light-reflectance than the thermosetting first resin.

20 Claims, 20 Drawing Sheets

(51) Int. Cl.
*G02B 7/00* (2021.01)
*H01L 33/48* (2010.01)

(56) References Cited

U.S. PATENT DOCUMENTS

| | | | |
|---|---|---|---|
| 2007/0195418 A1* | 8/2007 | Kogure | G02B 6/0053 |
| | | | 359/599 |
| 2009/0298376 A1* | 12/2009 | Guillien | F21V 31/005 |
| | | | 445/43 |
| 2011/0228398 A1 | 9/2011 | Sakaki et al. | |
| 2012/0099326 A1* | 4/2012 | Hammond | F21S 43/27 |
| | | | 362/311.02 |
| 2013/0027922 A1* | 1/2013 | Chen | G02B 19/0028 |
| | | | 362/187 |
| 2015/0075025 A1 | 3/2015 | Peil et al. | |
| 2016/0254500 A1* | 9/2016 | Kawata | H02J 7/00302 |
| | | | 362/157 |
| 2016/0377258 A1* | 12/2016 | Xu | F21S 4/28 |
| | | | 362/223 |
| 2017/0317251 A1 | 11/2017 | Sweegers et al. | |
| 2017/0370539 A1* | 12/2017 | Xu | F21S 4/28 |
| 2018/0306405 A1* | 10/2018 | Kong | G02B 3/08 |
| 2020/0073074 A1* | 3/2020 | Kishimoto | B29D 11/00269 |

FOREIGN PATENT DOCUMENTS

| | | |
|---|---|---|
| CN | 107167985 | 9/2017 |
| CN | 207133557 U | 3/2018 |
| JP | 06-079013 U | 11/1994 |
| JP | 2002-289926 | 10/2002 |
| JP | 2010-040801 | 2/2010 |
| JP | 2010-040802 | 2/2010 |
| JP | 5139915 B2 | 2/2010 |
| JP | 2010-103404 | 5/2010 |
| JP | 2011-062879 | 3/2011 |
| JP | 2011-197479 | 10/2011 |
| JP | 2012-119185 | 6/2012 |
| JP | 2012-185239 | 9/2012 |
| JP | 2012-185240 | 9/2012 |
| JP | 2014-006488 | 1/2014 |
| JP | 2015-090776 | 5/2015 |
| JP | 2015-090781 | 5/2015 |
| JP | 2016-164874 | 9/2016 |
| JP | 2017-533590 | 11/2017 |
| WO | WO 2013/164054 | 11/2013 |
| WO | WO 2015/025970 | 2/2015 |
| WO | WO 2015/146539 | 10/2015 |

* cited by examiner

LENS, LIGHT EMITTING DEVICE AND METHOD OF MANUFACTURING THE LENS AND THE LIGHT EMITTING DEVICE

CROSS-REFERENCE TO RELATED PATENT APPLICATION

The present application claims priority under 35 U. S. C. § 119 to Japanese Patent Application No. 2018-162679, filed Aug. 31, 2018. The contents of Japanese Patent Application No 2018-162679 are incorporated herein by reference in their entirety.

BACKGROUND OF THE INVENTION

Field of the Invention

The present disclosure relates to a lens and a light emitting device, and a method of manufacturing the lens and the light emitting device.

Discussion of the Background

Applications for flush light sources used in cellular phones and other mobile devices, a light emitting device may include an LED element mounted on a circuit board, a cover having an optical lens positioned facing the LED element, and a light-reflecting member integrally formed with the cover, for example, described in Japanese patent publication No. 5139915. In the light emitting device described in Japanese patent publication No. 5139915, a metal film is used as the light-reflecting member and the metal film is formed by way of, for example, vacuum vapor deposition.

SUMMARY OF THE INVENTION

A lens according to one embodiment of the present disclosure includes a cover part and a light-shielding part. The cover part includes a lens part having a plurality of lateral sides, a connection part constituting a plurality of lateral side walls each extending downward from a respective one of the plurality of lateral sides of the lens part, and a plurality of flange parts each extending outward from a lower-end portion of a corresponding one of the plurality of lateral side walls. The lens part and the connection part define a recess having an opening facing downward, the lens part defines a bottom surface of the recess. The plurality of lateral side walls define a plurality of lateral surfaces of the recess, which define an opening of the recess. Each of the plurality of flange parts extends outward from a periphery of the opening of the recess. The lens part, the plurality of flange parts, and the connection part are formed of a thermosetting first resin and continuous to one another. The light-shielding part covers a plurality of lateral end surfaces and an upper surface of each of the plurality of flange parts and outer lateral surfaces of the plurality of lateral side walls. The light-shielding part is formed of a thermosetting second resin having a greater light-absorptance or a greater light-reflectance than the thermosetting first resin.

A lens according to one embodiment of the present disclosure includes a cover part and a light-shielding part. The cover part includes a lens part having a plurality of lateral sides, a connection part constituting a plurality of lateral side walls each extending downward from a respective one of the plurality of lateral sides of the lens part, and a plurality of flange parts extending outward from a lower-end portion of a corresponding one of the plurality of lateral side walls. The lens part, the plurality of flange parts, and the connection part are formed of a thermosetting first resin and continuous to one another. The plurality of flange parts each have a thickness in a range of 5 μm to 30 μm. The light-shielding part covers a plurality of lateral end surfaces and an upper surface of each of the plurality of flange parts and outer lateral surfaces of the plurality of lateral side walls. The light-shielding part is formed of a thermosetting second resin having a greater light-absorptance or a greater light-reflectance than the thermosetting first resin.

A lens according to one embodiment of the present disclosure includes a cover part and a light-shielding part. The cover part includes a lens part having a plurality of lateral sides and a connection part constituting a plurality of lateral side walls each extending downward from a respective one of the plurality of lateral sides of the lens part. The lens part and the connection part define a recess having an opening facing downward, the lens part defines a bottom surface of the recess. The plurality of lateral side walls define lateral surfaces of the recess, which define the opening of the recess. The lens part and the connection part are formed of a thermosetting first resin and continuous to each other. The light-shielding part covers outer lateral surfaces of the plurality of lateral side walls and is formed of a thermosetting second resin having a greater light-absorptance or a greater light-reflectance greater than the thermosetting first resin.

A light emitting device according to one embodiment of the present disclosure includes a light emitting element and a lens. The lens includes a cover part and a light-shielding part. The cover part includes a lens part having a plurality of lateral sides, a connection part constituting a plurality of lateral side walls each extending downward from a respective one of the plurality of lateral sides of the lens part, and a plurality of flange parts each extending outward from a lower-end portion of a corresponding one of the plurality of lateral side walls. The lens part and the connection part define a recess having an opening facing downward. The lens part defines a bottom surface of the recess and the connection part defines a plurality of lateral surfaces of the recess. The plurality of lateral side walls define lateral surfaces of the recess, which define the opening of the recess. The recess is formed inward of the plurality of flange parts. The lens part, the plurality of flange parts, and the connection part are formed of a thermosetting first resin and continuous to one another. The light-shielding part covers a plurality of lateral end surfaces and an upper surface of each of the flange parts and outer lateral surfaces of the plurality of lateral side walls. The light-shielding part is formed of a thermosetting second resin having a greater light-absorptance or a greater light-reflectance than the thermosetting first resin. The lens part is disposed at a location allowing light from the light emitting element to be transmitted through the lens part.

A light emitting device according to one embodiment of the present disclosure includes a light emitting element and a lens. The lens includes a cover part and a light-shielding part. The cover part includes a lens part having a plurality of lateral sides, a connection part constituting a plurality of lateral side walls each extending downward from a respective one of the plurality of lateral sides of the lens part, and a plurality of flange parts each extending outward from a lower-end portion of a corresponding one of the plurality of lateral side walls. The lens part, the plurality of flange parts, and the connection part are formed of a thermosetting first resin and continuous to one another. The plurality of flange parts each have a thickness in a range of 5 µm to 30 µm. The light-shielding part covers a plurality of lateral end surfaces and an upper surface of each of the plurality of flange parts and outer lateral surfaces of the plurality of lateral side walls. The light-shielding part is formed of a thermosetting second resin having a greater light-absorptance or a greater light-reflectance than the thermosetting first resin. The lens part is disposed at a location allowing light from the light emitting element to be transmitted through the lens part.

A light emitting device according to one embodiment of the present disclosure includes a light emitting element and a lens. The lens includes a cover part and a light-shielding part. The cover part includes a lens part having a plurality of lateral sides, and a connection part constituting a plurality of lateral side walls each extending downward from a respective one of the plurality of lateral sides of the lens part. The lens part and the connection part define a recess having an opening facing downward. The lens part defines a bottom surface of the recess. The plurality of lateral side walls define lateral surfaces of the recess, which define the opening of the recess. The lens part and the connection part are formed of a thermosetting first resin and continuous to one another. The light-shielding part covers outer lateral surfaces of the plurality of lateral side walls and is formed of a thermosetting second resin having a greater light-absorptance or a greater light-reflectance than the thermosetting first resin. The lens part is disposed at a location allowing light from the light emitting element to be transmitted through the lens part.

A method of manufacturing a lens according to one embodiment of the present disclosure includes: forming a cover blank, the forming a cover blank comprising, injecting a thermosetting first resin in a first mold and curing the thermosetting first resin, to form a cover blank having a plurality of cover parts, each of the cover parts including a lens part having a plurality of lateral sides, a connection part constituting a plurality of lateral side walls each extending downward from a respective one of the plurality of lateral sides of the lens part, and a plurality of flange parts each extending outward from a lower-end portion of a corresponding one of the plurality of lateral side walls, the lens part and the connection part defining a recess having an opening facing downward, the lens part defining a bottom surface of the recess and the plurality of lateral side walls defining lateral surfaces of the recess, which define the opening of the recess, the recess being formed inward of the plurality of flange parts, and the lens part, the plurality of flange parts, and the connection part being continuous to one another; removing a part or all parts of the first mold; arranging the cover blank in a second mold; forming a lens blank, the forming a lens blank comprising, injecting a thermosetting second resin having a greater light absorptance or a greater light reflectance than the thermosetting first resin into the second mold and curing the thermosetting second resin, to form a lens blank having a light-shielding part between adjacent ones of the cover parts; and obtaining individual lenses, the obtaining individual lenses comprising, taking out the lens blank from the second mold, and cutting the lens blank at the light-shielding part located between adjacent one of the cover parts to obtain individual lenses each with a plurality of lateral end surfaces and an upper surface of each of the plurality of flange parts and the plurality of lateral side walls covered by the light-shielding part.

A method of manufacturing a lens according to one embodiment of the present disclosure includes: forming a cover blank, the forming a cover blank comprising, injecting a thermosetting first resin in a first mold and curing the thermosetting first resin, to form a cover blank having a plurality of cover parts, each of the cover parts including a lens part having a plurality of lateral sides, a connection part constituting a plurality of lateral side walls each extending downward from a respective one of the plurality of lateral sides of the lens part, and a plurality of flange parts each extending outward from a lower-end portion of a corresponding one of the plurality of lateral side walls, the lens part, the plurality of flange parts, and the connection part being formed continuous to one another, and the flange parts having a thickness in a range of 5 µm to 30 µm; removing a part or all parts of the first mold; arranging the cover blank in a second mold; forming a lens blank, the forming a lens blank comprising, injecting a thermosetting second resin having a greater light absorptance or a greater light reflectance than the thermosetting first resin into the second mold and curing the thermosetting second resin, to form a lens blank having a light-shielding part between adjacent ones of the cover parts; and obtaining individual lenses, the obtaining individual lenses comprising, taking out the lens blank from the second mold, and cutting the lens blank at the light-shielding part located between the adjacent ones of the cover parts to obtain individual lenses each with a plurality of lateral end surfaces and an upper surface of each of the plurality of flange parts and the plurality of lateral side walls covered by the light-shielding part.

A method of manufacturing a lens according to one embodiment of the present disclosure includes: forming a cover blank, the forming a cover blank comprising, injecting a thermosetting first resin in a first mold and curing the thermosetting first resin, to form a cover blank having a plurality of cover parts, each of the cover parts including a lens part having a plurality of lateral sides, a connection part constituting a plurality of lateral side walls each extending downward from a respective one of the plurality of lateral sides of the lens part, and a plurality of flange parts each extending outward from a lower-end portion of a corresponding one of the plurality of lateral side walls, the lens part, the plurality of flange parts, and the connection part being formed continuous to one another; removing the first mold; cutting the cover blank at the flange part located between adjacent ones of the cover parts; arranging the cut cover blank in a second mold; forming a lens blank, the forming a lens blank comprising, injecting a thermosetting second resin having a greater light absorptance or a greater light reflectance than the thermosetting first resin into the second mold and curing the thermosetting second resin to form a lens blank having a light-shielding parts between adjacent ones of the cover parts; and obtaining individual lenses, the obtaining individual lenses comprising, taking out the lens blank from the second mold, and cutting the lens blank at the light-shielding part located between the adjacent ones of the cover parts to obtain individual lenses each with a plurality of lateral end surfaces and an upper surface of each of the plurality of flange parts covered by the light-shielding part, the plurality of lateral side walls covered by the light-shielding part, and also an outer end surface of each of the plurality of flange parts covered by the light-shielding part.

A method of manufacturing a light emitting device according to one embodiment of the present disclosure includes providing a lens according one of the methods described above, and disposing the lens at a location allowing light from the light emitting element to be transmitted through the lens part of the lens.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

In the following, certain embodiments will be described with reference to the drawings. The embodiments shown below are to exemplify lenses, light emitting devices and methods of manufacturing those, to give concrete forms to technical ideas of the present invention, and the scope of the present invention is not limited thereto. The sizes, materials, shapes and the relative positions of the members described in the embodiments are given as examples and not as a limitation to the scope of the invention unless specifically stated. The sizes and positional relationships of the members in each of drawings may be occasionally exaggerated for ease of explanation.

First Embodiment

Figure 1:
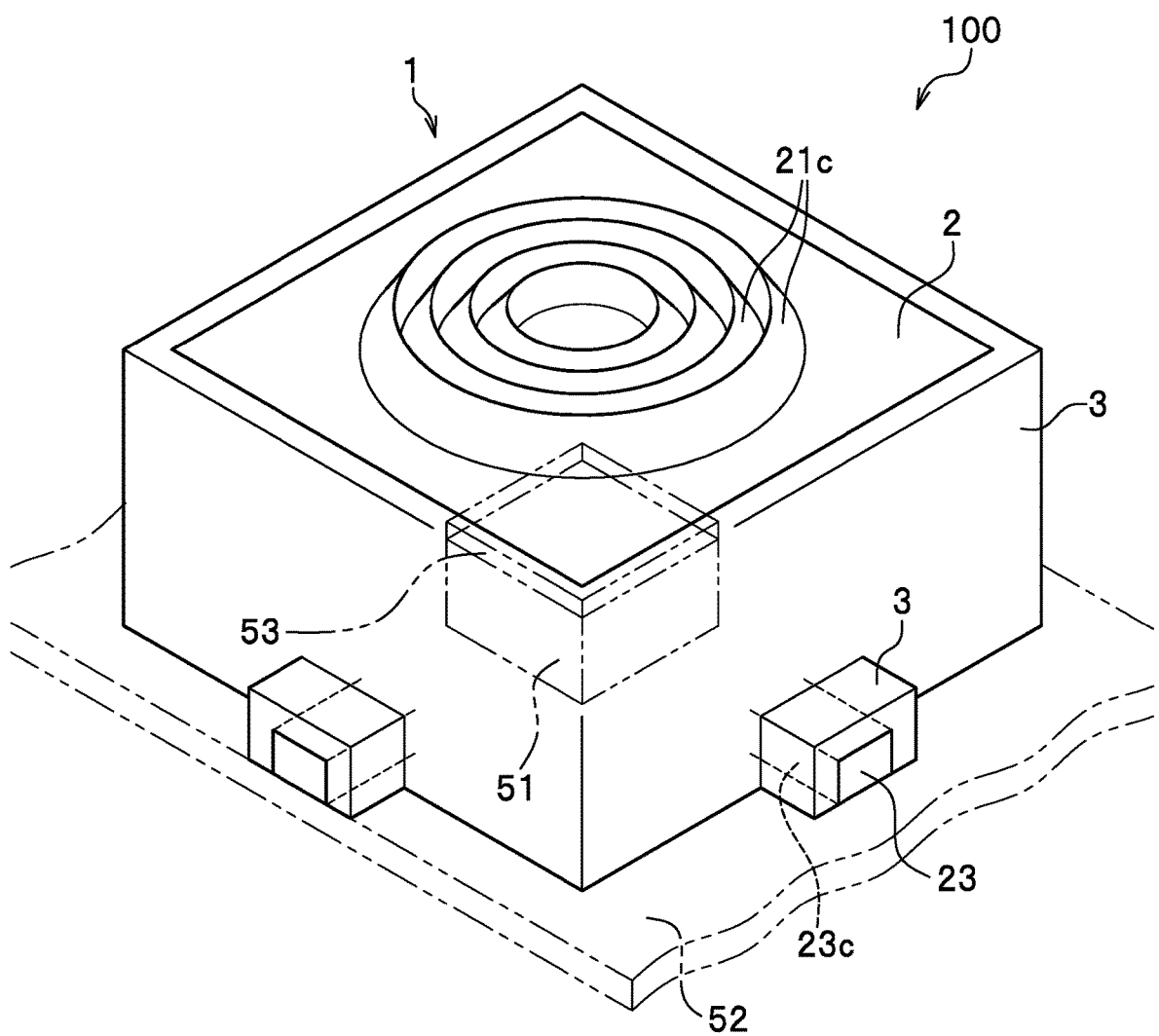
FIG. 1 is a perspective view schematically showing a structure of a light emitting device that includes a lens according to a first embodiment.
Figure 2:
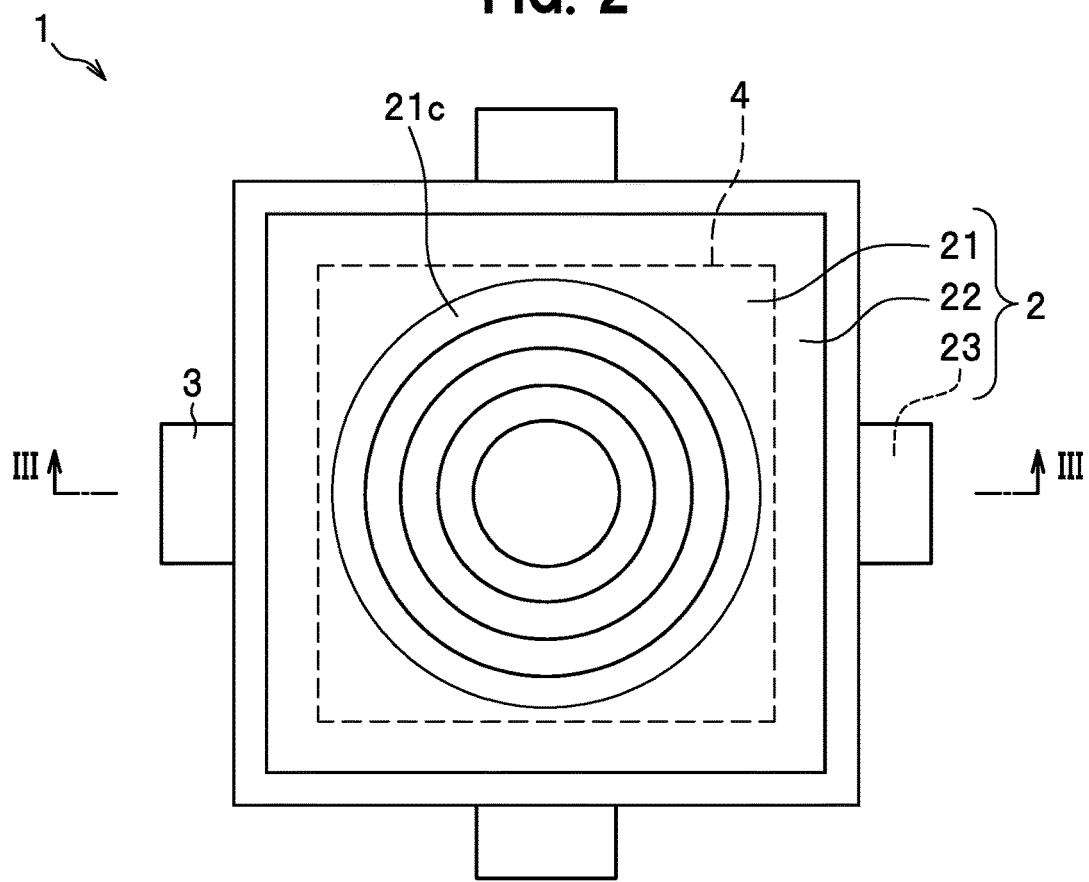
FIG. 2 is a plan view schematically showing a structure of a lens according to the first embodiment.
Figure 3:
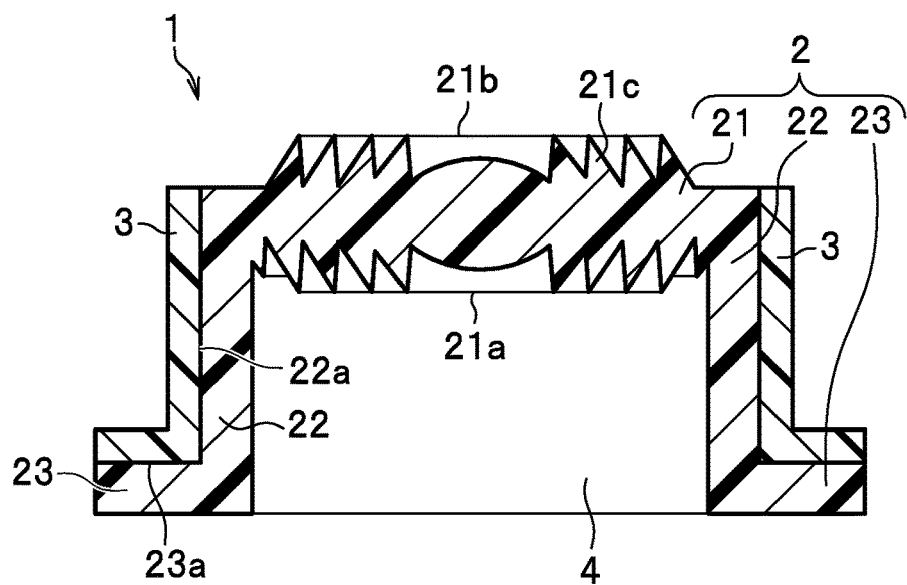
FIG. 3 is a cross-sectional view, taken along line III-III of FIG. 2, schematically showing a structure of a lens according to the first embodiment, in which the line is passing through the center of the lens.
Figure 4:
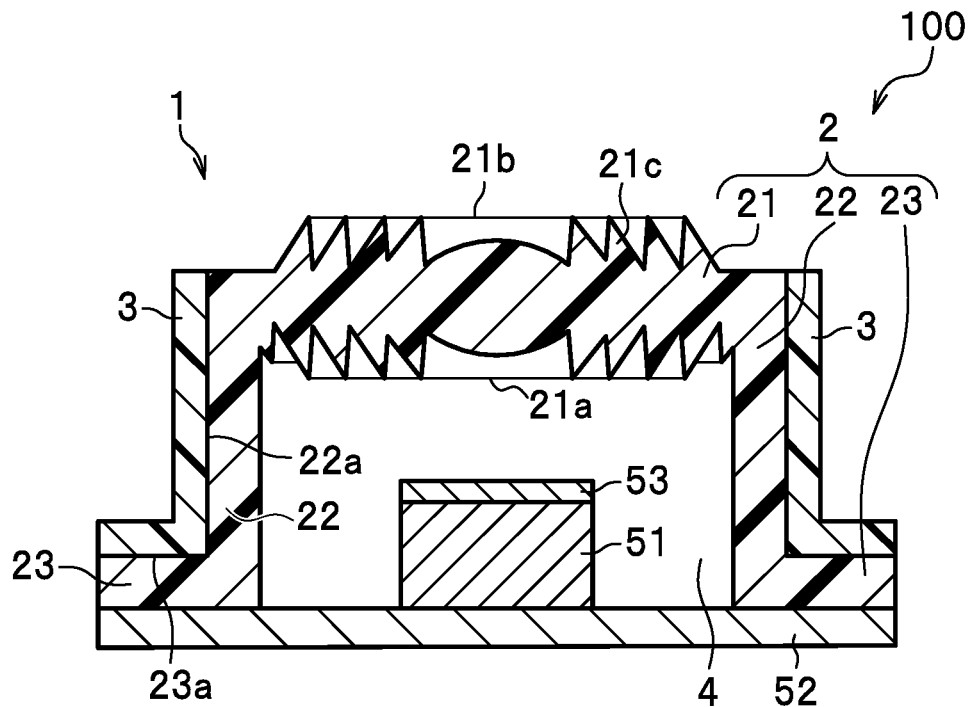
FIG. 4 is a cross-sectional view schematically showing a structure of a light emitting device according to the first embodiment, taken along a line passing through the center of the light emitting device.

FIG. 1 is a perspective view schematically showing a structure of a light emitting device that includes a lens according to the first embodiment. FIG. 2 is a plan view schematically showing a structure of a lens according to the first embodiment. FIG. 3 is a cross-sectional view, taken along line III-III of FIG. 2, schematically showing a structure of a lens according to the first embodiment, in which the line is passing through the center of the light emitting device. FIG. 4 is a cross-sectional view schematically showing a structure of a light emitting device according to the first embodiment, taken along a line passing through the center of the light emitting device.

The light emitting device 100 includes a light emitting element 51 and a lens 1. The light emitting device 100 further includes a substrate 52 on which the light emitting element 51 is mounted.

Lens

Lens 1 will be described.

The lens 1 includes a cover part 2 and a light-shielding part 3.

The cover part 2 of the lens 1 includes a lens part 21 having a plurality of lateral sides, a connection part 22 constituting a plurality of lateral side walls each extending downward from a respective one of the plurality of lateral sides of the lens part 21, and a plurality of flange parts 23 each extending outward from a lower-end portion of a corresponding one of the lateral side walls constituted by the connection part 22. The lens part 21, the connection part 22, and the plurality of flange parts are formed of a thermosetting first resin and continuous to one another. The light-shielding part 3 of the lens 1 covers a plurality of lateral end surfaces 23c and an upper surface 23a of each of the plurality of flange parts 23 and outer lateral surfaces of the lateral side walls constituted by the connection part 22. The light-shielding part 3 is formed of a thermosetting second resin having a greater light-absorptance or a greater light-reflectance than the thermosetting first resin. The lens 1 is, for example, used as a flash lens for a cellular phone or the like.

Cover Part

The cover part 2 is formed to cover the light emitting element 51 to be described below. The cover part 2 includes a lens part 21, a plurality of flange parts 23, and a connection part 22, which are formed of a thermosetting first resin and continuous to one another. In the cover part 2, the lens part 21 and the connection part 22 define a recess 4 having an opening facing downward, the lens part 21 defines a bottom surface of the recess 4, and the connection part 22 defines a plurality of lateral surfaces of the recess 4, which define an opening of the recess 4. The plurality of flange parts 23 are each connected to a corresponding lower-end portion of a respective one of the plurality of outer lateral sides of the connection part 22.

The lens part 21 is a member through which light from the light emitting element 51 can be emitted to the outside in parallel light, condensed light, or diffused light. The lens part 21 includes a light incidence surface 21a where light emitted from the light emitting element 51 enters, and a light emitting surface 21b at an opposite side to the light incidence surface where the incident light is refracted and is emitted to the outside.

The outer shape in a plan view of the lens part 21 can be selected from various appropriate shapes, examples thereof include a polygonal shape such as a quadrangular shape, a hexagonal shape, and an octagonal shape, a circular shape and an elliptic shape. A center portion of the lens part 21 serves as a lens preferably has a circular shape or an elliptic shape, where a circular shape is more preferable. The lens part 21 has a maximum thickness of, for example, in a range of 0.1 mm to 10 mm, preferably in a range of 0.5 mm to 5 mm.

For the lens part 21, a Fresnel lens, a total internal reflection (TIR) lens, or the like can be used, in which, a Fresnel lens is preferable. The Fresnel lens 21 may have either a single lens-center or a plurality of lens-centers. When a plurality of Fresnel lenses 21 are employed, the Fresnel lenses are disposed corresponding to the arrangement of the light emitting element 51, such that an odd number of Fresnel lenses are preferably disposed in a zigzag form, and an even number of Fresnel lenses are preferably disposed in a square matrix form.

The Fresnel lens 21 includes a plurality of concentric circles of ridges 21c on the light incidence surface 21a and on the light emitting surface 21b. When combined, the cross-sectional shapes of the plurality of ridges 21c form a lens curved surface of a single convex lens. The plurality of ridges 21c are preferably arranged in concentric circles or concentric ellipsoids in a radial direction of the Fresnel lens 21. In the Fresnel lens 21, the base plane of the plurality of ridges 21c can be flat, or concave or convex.

Each of the ridges 21c has a cross-sectional shape formed with a straight portion at the center-side and a segment of a curved surface of a lens at the outer-side. The profile of each of the ridges 21c may be formed with inwardly curved segment either a concave curve or a convex curve, in conformity to the direction of light to be emitted. The angles (Fresnel angles) at the tips of the ridges 21c are adjusted such that light from the light emitting element 51 is emitted to the outside in parallel light.

The connection part 22 constitutes lateral side walls each extending downward from a respective one of the lateral sides of the lens part 21 such that an upper end portion of each side walls is contiguous to an upper end portion of the respective one of the lateral sides of the lens part 21, that the side walls constituted by the connection part 22 extend downward in a right angle with respect to the lens part 21, and that a lower-end portion of the side walls of the connection part 22 is contiguous to the flange part 23 in, for example, a right angle. The connection part 22 and the lens part 21 define the recess 4 having the opening facing downward to accommodate a light emitting element 51. In a cross-sectional view, the recess 4 is preferably of a rectangular U-shape, but a semicircular shape or a semi-elliptical shape can also be employed. The lens part 21 has a rectangular outer peripheral shape in a plan view, such that the connection part 22 is disposed with respect to all the sides of the lens part 21, in which each two opposite sides of the connection part 22 are substantially in parallel to each other. The connection part 22 has a thickness of, for example, in a range of 50 μm to 200 μm, preferably in a range of 50 μm to 100 μm. The connection part 22 is preferably formed such that the lens part 21 is located at a center of a bottom surface of the recess 4.

Each of the plurality of flange parts 23 is formed continuous to at a predetermined locations of the outer periphery of the connection part 22, at a lower end portion of respective one of the lateral side walls constituted by the connection part 22, and is extended outward at a substantially right angle with respect to the corresponding outer lateral side of the connection part 22. Each of the flange parts 23 is a member having a plate-like shape and is used for bonding or securing to the substrate 52 on which the light emitting element 51 is mounted.

The volume of each of the flange parts 23, that is, the surface area of each of the flange parts 23 can be reduced by providing the plurality of flange parts 23 at portions of the outer periphery of the connection part 22. Accordingly, when the lens 1 is in operation, leaking of light in lateral directions of the lens 1, particularly leaking of light through the flange parts 23 can be further reduced.

The flange parts 23 are disposed at locations symmetrical with respect to the center of the lens in a plan view. This arrangement allows for stable bonding or fixing of the flange part 23 with the substrate 52. In the first embodiment, a single flange part 23 is disposed on a lower end portion of each of the lateral surfaces of the connection part 22, such that a total of four flange parts 23 are disposed on the entire outer periphery of the connection part 22. Each of the flange parts 23 is disposed at a width center of the lower end portion of the corresponding outer lateral surface of the connection part 22. With this arrangement, the flange parts 23 disposed on each two facing lateral surfaces of the connection part 22 are substantially symmetric with respect to the center of the lens part 21 in a plan view.

The flange part 23 preferably has a thickness in a range of 5 μm to 30 μm. The plurality of flange parts 23 are formed with a small thickness, reduced to the range of 5 μm to 30 μm, such that when the lens 1 is in operation, leaking of light through the lateral sides of the lens 1, particularly leaking of light through the flange parts 23 can be reduced. Each of the flange parts 23 preferably has a thickness of 20 μm or smaller.

The flange parts 23 are extended outward from corresponding portions of the lower end portions of the connection part 22, with an extending distance preferably in a range of 200 μm to 3,000 μm. This arrangement allows for stable bonding or securing between the flange parts 23 and the substrate 52. This arrangement can also facilitate applying an adhesive on the flange parts 23 to bond with the substrate 52.

Each of the flange parts 23 has a width preferably in a range of 50 μm to 1,000 μm, more preferably in a range of 50 μm to 500 μm, further preferably in a range of 100 μm to 300 μm, in a direction parallel to the lateral surface of the connection part 22 to which the flange part 23 is connected. Accordingly, when the lens 1 is in operation, leaking of light through lateral sides of the lens 1, particularly through the flange parts 23 can be further reduced. With this arrangement, when the flange parts 23 are bonded to the substrate 52 by using an adhesive material, application of the adhesive material can be facilitated, and bonding or securing of the flange part 23 with the substrate 52 can be performed more stably.

The thermosetting first resin used to form the cover part 2 is preferably a light-transmissive thermosetting resin. Examples of the thermosetting resin include phenol resin, urea resin, melamine resin, epoxy resin, silicone resin, and polyurethane resin, of those, silicone resin is preferable. Compared to thermoplastic resins such as polycarbonate resins that have been used, the use of thermosetting resins having good light-resisting properties and good heat-resisting properties can reduce degradation of the cover part 2, and further can reduce darkening of the cover part 2 with time that develops exponentially due to concentration of light or heat to portions discolored by degradation. The silicone resin exhibits high flowability when heated, which allows forming of a flange part with a small thickness.

Light-Shielding Part

The light-shielding part 3 of the lens 1 covers outer lateral surfaces 22a of the lateral side walls constituted by the connection part 22 and an upper surface 23a of each of the plurality of flange parts 23 and formed of a thermosetting second resin having a greater light-absorptance or a greater light-reflectance than the thermosetting first resin.

The light-shielding part 3 is disposed in conformity to the shapes of the connection part 22 and the flange parts 23, and with a substantially uniform thickness. More specifically, in a cross section, the light-shielding part 3 has a shape in conformity to the outer lateral surface 22a of the lateral side walls constituted by the connection part 22, and at portions having the flange parts 23, the shape of the light-shielding part 3 is in conformity to the outer lateral surfaces 22a of the lateral side walls constituted by the connection part 22 and the upper surfaces 23a of the flange parts 23, such that at portions with the flange parts 23, the shape of the light-shielding part 3 can be, for example, a bent shape such as an L-shape. The light-shielding part 3 preferably has a thickness in a range of 200 μm to 3,000 μm in a direction normal to the corresponding one of the lateral side walls constituted by the connection part 22 and in a direction normal to the flange parts 23. With this arrangement, the outer lateral surface 22a of the lateral side walls constituted by the connection part 22, the lateral end surfaces 23a and the upper surfaces 23a of the flange parts 23 are reliably covered by the light-shielding part 3, and thus light transmitting through the connection part 22 and the flange parts 23 can be reliably reduced. The light-shielding part 3 is disposed on the lateral surfaces 22a of the lateral side walls constituted by the connection part 22 and the upper surfaces 23a of the flange parts 23 without using an adhesive material, such that degradation and/or detachment of the adhesive material, and absorption of light by the adhesive material will not occur. The lateral end surfaces 23c of the flange parts 23 are the lateral surfaces defined by a length direction and a thickness direction of the flange parts 23.

The light-shielding part 3 covers the lateral end surfaces 23c and the upper surface 23a of each of the flange parts 23 and outer lateral surfaces of the connection part 22. At least a portion of one or more of the lateral end surfaces 23c of each of the flange parts 23 are covered by the light-shielding part 3. For example, one of the lateral end surfaces 23c of each of the flange parts 23 may be covered by the light-shielding part 3, or both the lateral end surfaces 23c of each of the flange parts 23 may be partially covered by the light-shielding part 3. It is preferable that the lateral end surfaces 23c of the flange parts 23 are entirely covered by the light-shielding part 3. With the lateral end surfaces 23c of the flange parts 23 are entirely covered by the light-shielding part 3, when the lens 1 is in operation, leaking of light to a lateral side of the lens 1, particularly leaking of light through the flange parts 23 can be further reduced.

The thermosetting second resin that forms the light-shielding part 3 is a thermosetting resin having a greater light-absorptance or a greater light-reflectance than the light-transmissive first resin. For the thermosetting second resin, a black colored resin or white colored resin of a light-transmissive thermosetting resin similar to that used as the light-transmissive first resin, preferably a silicone resin, containing a black color material such as carbon having a high light absorptance, or a white color material such as titanium oxide having a high light reflectance can be used. With this, the connection part 22 formed of the light-transmissive first resin can be covered by the light-shielding part 3 formed of the thermosetting second resin having a high light absorptance or a high light reflectance, such that when used as the lens 1, light from the light emitting element 51 is absorbed or reflected at the light-shielding part 3 and leaking of light in a lateral sides of the lens 1, particularly, through the connection part 22 can be reduced.

Light Emitting Device

Next, the light emitting device 100 will be described.

The light emitting device 100 includes a light emitting element 51, a lens 1, and preferably a substrate 52. A lens part 21 of the lens 1 is disposed at a position such that light from the light emitting element 51 can be transmitted therethrough. The light emitting device 100 may further include a light-transmissive member 53. The light emitting device 100 includes the lens 1 whose lateral surfaces are covered by the light-shielding part 3, such that light from the light emitting element 51 is absorbed or reflected by the light-shielding part 3, and thus leaking of light in the lateral sides of the lens 1 can be reduced. The lens 1 is similar to that described above and therefore the description thereof will be appropriately omitted.

Light Emitting Element

The light emitting element 51 preferably include at least a nitride-based semiconductor layered structure. The nitride-based semiconductor layered structure includes a first semiconductor layer (for example, an n-type semiconductor layer), a light emitting layer, and a second semiconductor layer (for example, a p-type semiconductor layer) layered in this order, and is configured to generate light. The nitride-based semiconductor layered structure has a thickness of preferably 30 μm or less.

The first semiconductor layer, the light-emitting layer, and the second semiconductor layer can be respectively an appropriate type, made of appropriate materials. Examples thereof include a Group III-V compound semiconductor and a Group II-VI compound semiconductor. More specific examples include nitride-based semiconductor materials such as $In_XAl_YGa_{1-X-Y}N$ (0≤X, 0≤Y, X+Y≤1); for example, InN, AlN, GaN, InGaN, AlGaN, InGaAlN, or the like. For the thickness and structure of each of the layers, any appropriate thickness and structure known in the art can be employed. The light emitting element 51 generally has a quadrangular shape in a plan view, but may have a circular shape, an elliptical shape, or a polygonal shape such as a triangular shape, a quadrangular shape, or a hexagonal shape in a plan view.

Light-Transmissive Member

It is preferable that an upper surface of the light emitting element 51 is covered by a light-transmissive member 53, which can be disposed by using a spraying method or the like. The light-transmissive member 53 is configured to protect the light emitting element 51 from an external force, dust, moisture, or the like, and also to improve heat-resisting properties, weather resistant properties, and light-resisting properties of the light emitting element 51. It is preferable that the light-transmissive member 53 can transmit 60% or greater of light emitted from the light emitting element 51. Such a light-transmissive member 53 can be formed of a thermosetting resin, a thermoplastic resin, a modified resin of such a resin, a hybrid resin which includes one or more of those resins, or the like. Specific examples thereof include epoxy resin, modified epoxy resin, silicone resin, modified silicone resin, and hybrid silicone resin.

In order to adjust the color of emitted light, the light-transmissive member 53 preferably contains a fluorescent material to convert the wavelength of light from the light emitting element 51. For the fluorescent material, a known material in the art can be used. Examples of the fluorescent material include yttrium aluminum garnet (YAG)-based fluorescent material activated with cerium.

The light-transmissive member 53 may contain a filler material (for example, a diffusion agent, a coloring agent, or the like). Examples of the filler material include silica, titanium oxide, zirconium oxide, magnesium oxide, glass, a crystal or sintered body of a phosphor, and a sintered body of a phosphor and an inorganic binding material.

Substrate

The substrate 52 is configured to mount a light emitting element 51, and for example, includes a base material made of such as sapphire, spinel, or SiC, and a wiring pattern formed on the base material.

The light emitting element 51 is preferably flip-chip mounted on the substrate 52. A single light emitting element 51 may be mounted on the substrate or a plurality of light emitting elements 51 may be mounted on the substrate 52. When a plurality of light emitting element 51 are mounted on the substrate 52, the light emitting elements 51 may be arranged irregularly, or arranged regularly such as in rows and columns, or periodically. The type of connection used in connecting the plurality of light emitting elements 51 can be in series, in parallel, in series-parallel or in parallel-series.

Positional Arrangement of Light Emitting Element and Lens

The lens 1 is disposed such that light from the light emitting element 51 can pass through the lens part 21. The lens 1 is disposed such that the lens part 21 faces the light emitting element 51 and the flange part 23 is connected to the substrate 52 through the plurality of flange parts 23. Accordingly, the lens 1 is disposed on the substrate 52 with the lens part 21 facing the light emitting element 51, such that leaking of light in lateral sides of the lens 1 from the light emitting element 51 through the flange parts 23 can be reduced.

The light emitting element 51 is disposed spaced apart from the lens part 21 and the connection part 22. More specifically, a depth of the recess 4 defined by the lens part 21 and the lateral side walls constituted by the connection part 22 is in a range of about 0.4 mm to 1.5 mm. Accordingly, a gap between the bottom surface of the recess 4 and the upper surface of the light emitting element 51 is in a range of about 0.05 mm to 0.5 mm. With this arrangement, heat from the light emitting element 51 can be prevented from directly conducted to the lens part 21 and thermal degradation of the lens part 21 can be reduced.

In the lens 1, the connection part 22 is formed such that a distance from the lens part (Fresnel lens) 21 to the light emitting element 51 is smaller than a distance from the connection part 22 to the light emitting element 51. In the lens 1, a recess 4 is formed with the lens part (Fresnel lens) 21 and the connection part 22 such that a distance from the lens part (Fresnel lens) 21 to the light emitting element 51 is smaller than a distance from the connection part 22 to the light emitting element 51. More specifically, the center of the light emitting element 51 (or a geometrical center of the light emitting element 51) is opposite to the center of the lens part (Fresnel lens) 21 (or a geometrical center of the lens part (Fresnel lens)) 21. That is, the lens 1 is disposed such that the center of the ridges 21c arranged in concentric circles or concentric ellipsoids and the center of the light emitting element 51 are on the optical axis of the Fresnel lens. But, when the lens includes a plurality of lens parts 21, that is, when the lens is a compound eye lens, the light emitting elements 51 each corresponding to respective one of the plurality of lens parts 21 may be disposed with a shift relative to the respective centers described above, such that the centers of the light emitting elements 51 are located closer to the center of the entire lens. With the arrangements of the light emitting elements 51 described above, excessive narrowing of the gap between the light emitting elements 51 and the connection part 22 and the gap between the light emitting elements 51 and the flange parts 23 can be avoided, such that light of the light emitting elements 51 passing through the flange parts 23 can be reduced.

Method of Manufacturing Lens

Next, a method of manufacturing a lens will be described.

Figure 5:
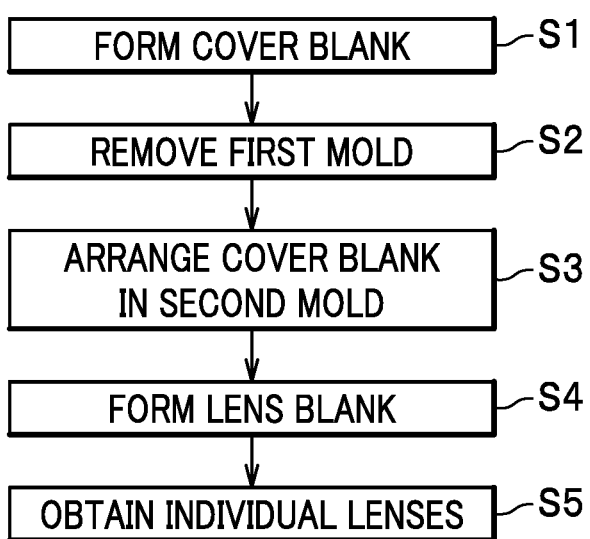
FIG. 5 is a flow chart showing a flow of a method of manufacturing a lens according to the first embodiment.
Figure 6A:
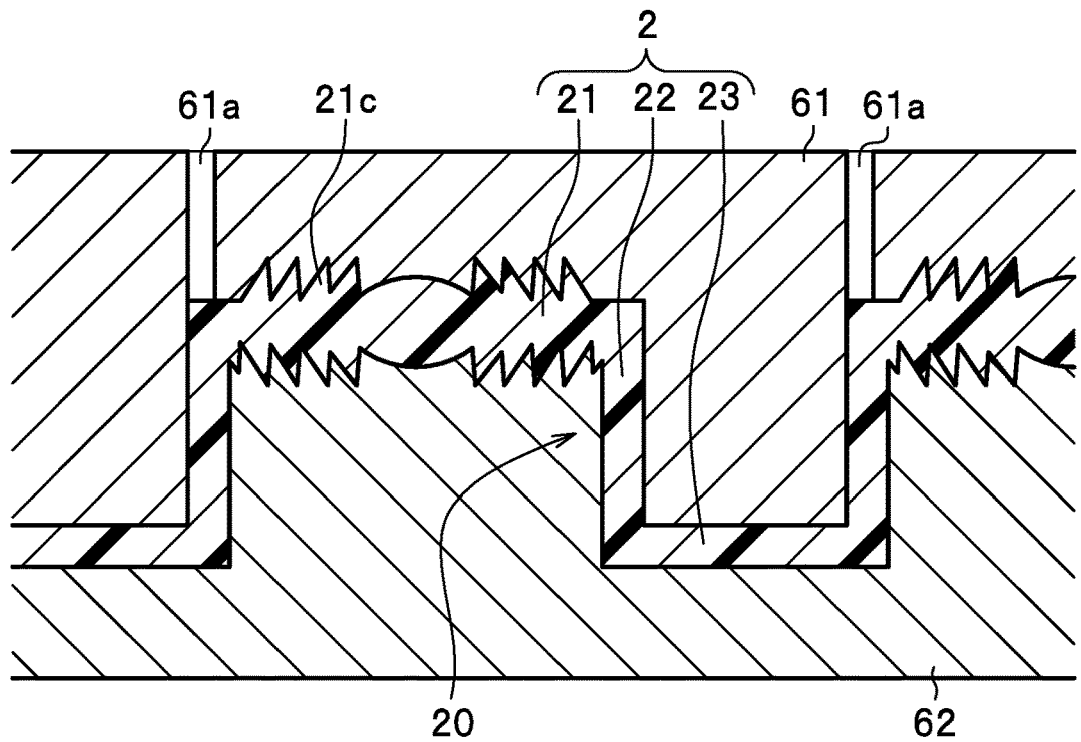
FIG. 6A is a cross-sectional view schematically illustrating forming a cover blank in a method of manufacturing a lens according to the first embodiment.
Figure 6B:
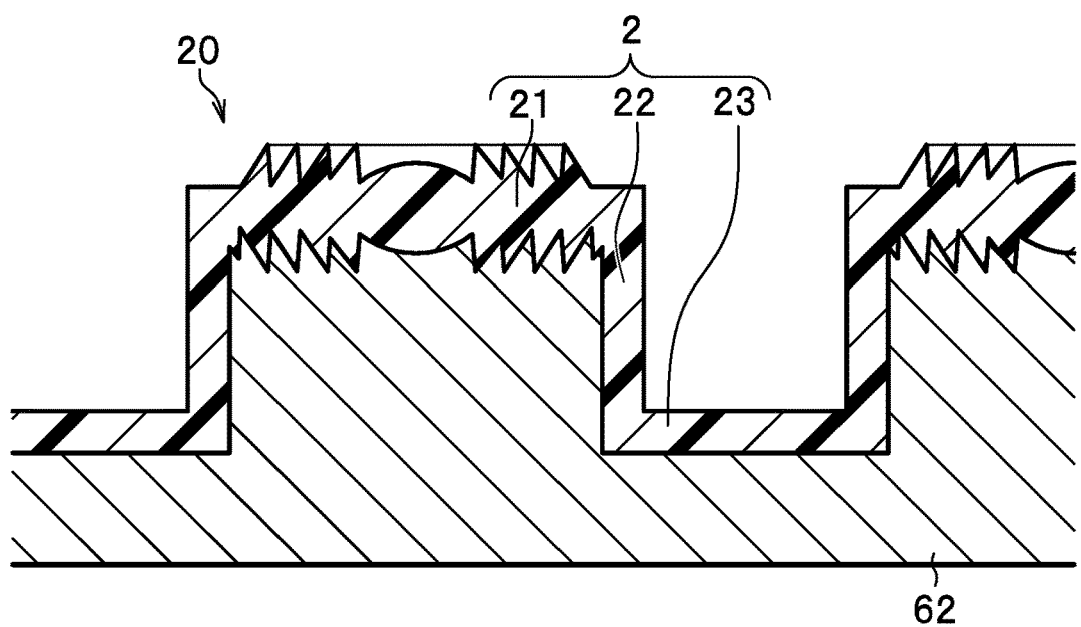
FIG. 6B is a cross-sectional view schematically showing removing a first mold in a method of manufacturing a lens according to the first embodiment.
Figure 6C:
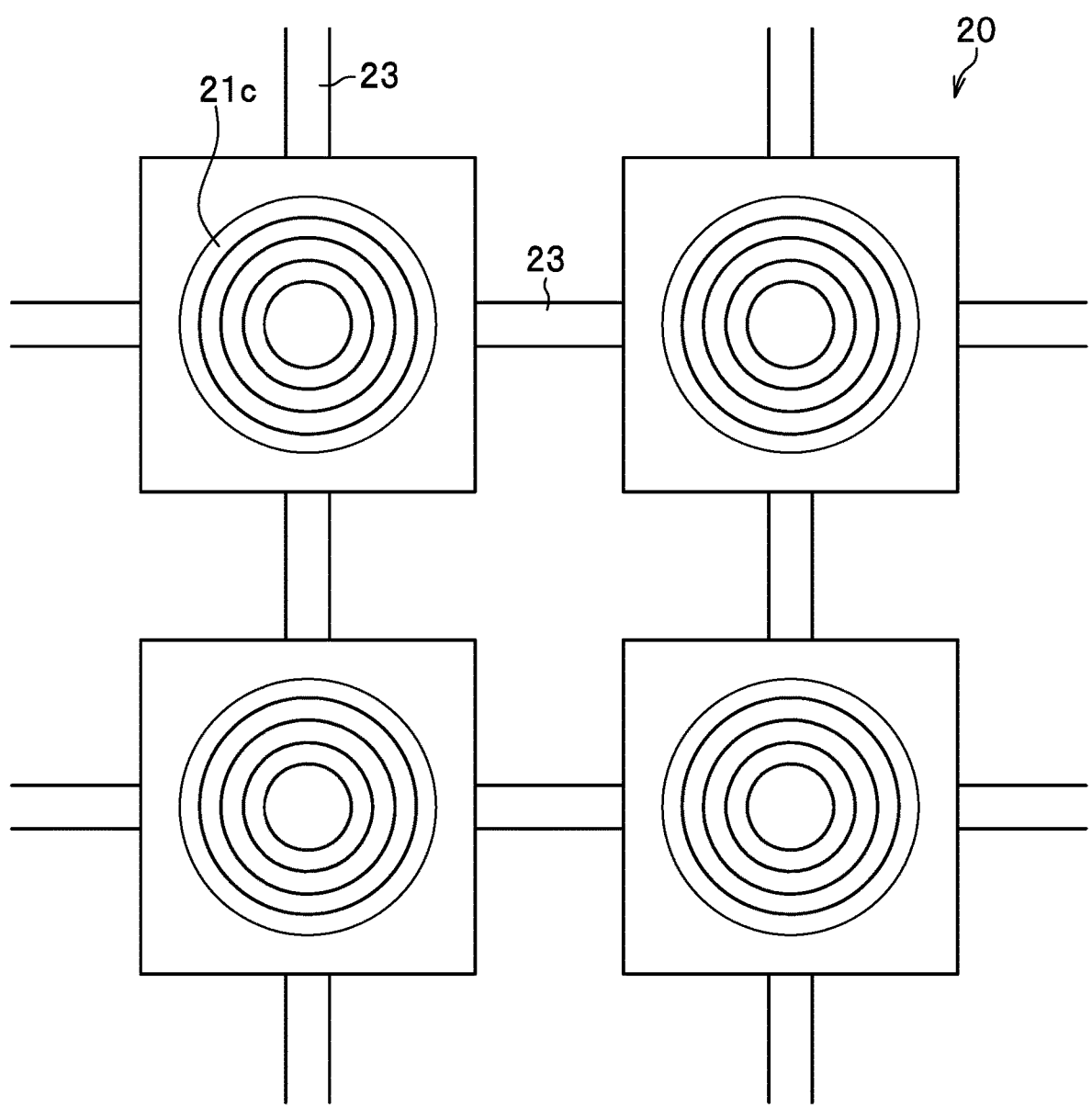
FIG. 6C is a plan view schematically showing a structure of the cover blank in a method of manufacturing a lens according to the first embodiment.
Figure 6D:
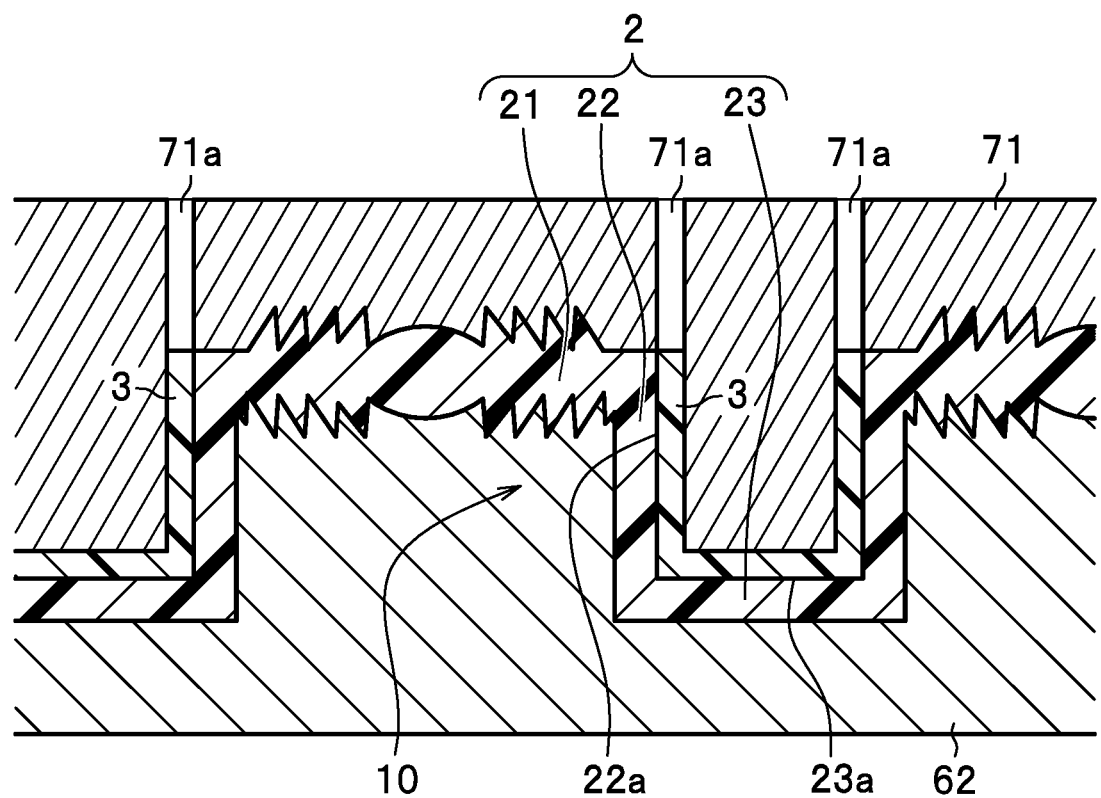
FIG. 6D is a cross-sectional view schematically illustrating arranging a cover blank in a second mold and forming a lens blank in a method of manufacturing a lens according to the first embodiment.
Figure 6E:
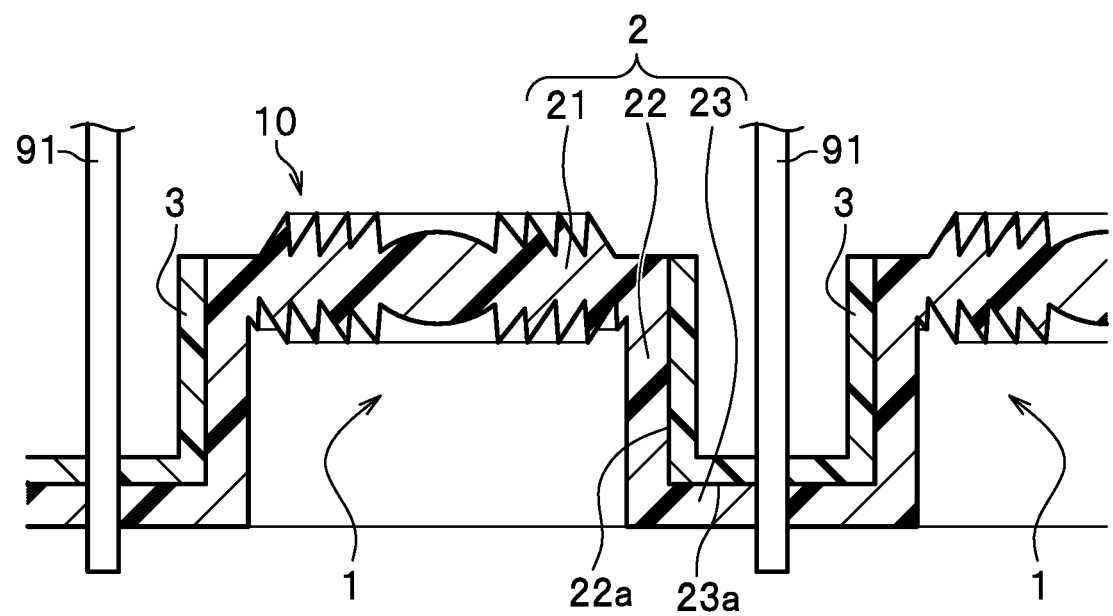
FIG. 6E is a cross-sectional view schematically illustrating cutting a lens blank to obtain individual lenses in a method of manufacturing a lens according to the first embodiment.

FIG. 5 is a flow chart showing a procedure of a method of manufacturing a lens according to the first embodiment. FIG. 6A is a cross-sectional view schematically illustrating forming a cover blank in a method of manufacturing a lens according to the first embodiment. FIG. 6B is a cross-sectional view schematically showing removing a first mold in a method of manufacturing a lens according to the first embodiment. FIG. 6C is a plan view schematically showing a structure of the cover blank in a method of manufacturing a lens according to the first embodiment. FIG. 6D is a cross-sectional view schematically illustrating arranging a cover blank in a second mold and forming a lens blank in a method of manufacturing a lens according to the first embodiment. FIG. 6E is a cross-sectional view schematically illustrating cutting a lens blank into individual lenses in a method of manufacturing a lens according to the first embodiment.

FIG. 6A, FIG. 6B, FIG. 6D, and to FIG. 6E illustrate producing a plurality of lens at once, but description below focuses on a single lens and description of other adjacent lenses will be omitted.

The method of manufacturing a lens 1 includes forming (S1) a cover blank, removing (S2) a first mold, arranging (S3) the cover blank in a second mold, forming (S4) a lens blank, and obtaining (S5) a lens, which are performed in this order. Accordingly, a lens 1 with less leaking of light can be obtained.

The materials and arrangements of the members are similar to those described for the lens 1 and therefore the description thereof may be appropriately omitted.

Forming Cover Blank

In the forming (S1) a cover blank, a thermosetting first resin is injected in a first mold to form a cover blank 20 having a plurality of cover parts 2 a respective one of the cover parts 2 having a lens part 21 having a plurality of lateral sides, a connection part 22 constituting a plurality of lateral side walls each extending downward from a respective one of the plurality of lateral sides of the lens part 21, and a plurality of flange parts 23 each extending outward from a lower-end portion of a corresponding one of the plurality of lateral side walls constituted by the connection part 22. The lens part 21, the connection part 22, and the plurality of flange parts 23 are formed continuous with one another.

In the forming (S1) a cover blank, an upper mold 61 and a lower mold 62 adapted for transfer molding are employed as the first mold. The upper mold 61 and the lower mold 62 are closed, and the thermosetting first resin, which is heated and softened, is injected under pressure into the first mold through a resin injection port 61a formed in the upper mold 61. The thermosetting first resin is cured in the heated mold, such that a cover blank 20 having a plurality of cover parts 2 connected one another at corresponding portions of the flange parts 23 is molded.

In the forming (S1) the cover blank, the upper mold 61 and the lower mold 62 are designed to produce a cover blank 20 having a plurality of cover parts 2, in each of the cover parts 2 a recess being defined by a lens part 21 and a connection part 22, with the recess formed inward of the plurality of flange parts 23. Each of the lens parts 21 of the cover blank 20 thus produced has a plurality of ridges 21c at both upper and lower sides. In the forming (S1) the cover blank, the upper mold 61 and the lower mold 62 are designed to produce a cover blank 20 having a plurality of cover parts 2 each of the cover parts 2 including the plurality of flange parts 23 having a thickness in a range of 5 µm to 30 µm.

Removing First Mold

In the removing (S2) the first mold, a part or all the parts of the first mold is removed after the cover blank 20 is formed. In the first embodiment, the upper mold 61, which is a part of the first mold, is removed and the molded product of the cover blank 20 is held by the lower mold 62.

Arranging Cover Blank in Second Mold

In the arranging (S3) the cover blank in the second mold, a different upper mold 71 that is also adapted for transfer molding is arranged on the lower mold 62 that holds the cover blank 20. In the arranging (S3) the cover blank in the second mold, a different upper mold 71 and the lower mold 62 are used as the second mold.

Forming Lens Blank

In the forming (S4) a lens blank, a thermosetting second resin having a light-absorptance or a light-reflectance greater than a light-absorptance or light-reflectance of the thermosetting first resin is injected in the second mold and cured, to form a lens blank 10 having a light-shielding part 3 between adjacent cover parts 2.

In the forming (S4) a lens blank, the upper mold 71 and the lower mold 62 are closed, and the thermosetting second resin, which is heated and softened, is injected under pressure into the second mold through a resin injection port 71a formed in the upper mold 71. The thermosetting second resin is cured in the heated mold such that a lens blank 10 having a bent shape that is in conformity to the shape of the outer lateral surface 22a of the lateral side walls constituted by the connection part 22 and covering the outer end surfaces 23b of each of the flange parts 23 is formed between adjacent cover parts 2. In the forming (S4) a lens blank, the light-shielding part 3 is also disposed on the second lateral end surfaces 23c of each of the flange parts 23. At least a portion of each of the lateral end surfaces 23c of each of the flange parts 23 can be covered by the light-shielding part 3, but the lateral end surfaces 23c of each of the flange parts 23 are preferably completely covered by the light-shielding part 3.

Obtaining Individual Lenses

As shown in FIG. 6E, in the obtaining (S5) individual lenses, individual lenses 1 are singulated from the lens blank 10. That is, in the obtaining (S5) individual lenses, all parts of the second mold are removed to take out the lens blank 10, and the lens blank 10 is cut along a center of the light-shielding part 3 between adjacent cover parts 2. The singulating is performed by cutting at the light-shielding part 3, thus obtaining individual lenses 1 each having the light-shielding part 3 covering the lateral end surfaces 23c and the upper surface 23a of the flange parts 23 and the outer lateral surfaces of the connection part 22.

In the obtaining (S5) individual lenses, the lens blank 10 is cut along the center of the light-shielding part 3 between the outer lateral surfaces 22a of adjacent connection parts 22 and between outer end surfaces 23c of adjacent flange parts 23, to obtain individual lenses 1 each having the light-shielding part 3 covering the outer lateral surfaces 22a of the lateral side walls constituted by the connection part 22 and the lateral end surfaces and the upper surface 23a of each of the flange parts 23. In a cross-section, the light-shielding part 3 of each of the individual lenses 1 has a shape in conformity to the shapes of the outer lateral surfaces 22a of the lateral side walls constituted by the connection part 22, and at portions having the flange parts 23, the light-shielding part 3 has a ben shape in conformity to the shapes of the outer lateral surfaces 22a of the lateral side walls constituted by the connection part 22 and shapes of the upper surfaces 23a of the flange parts 23. Cutting at the light-shielding part 3 can be performed by using a cutting tool 91 such as a known blade or the like. It is preferable to adjust the cutting width of the cutting tool 91 such that the flange parts 23 of the individual lens 1 to be obtained have a length in a range of 200 µm to 3,000 µm.

Method of Manufacturing Light Emitting Device

Next, a method of producing a light emitting device 100 will be described. Although the method of manufacturing the light emitting device 100 is not shown in the drawings, the method will be described with reference to FIG. 1 and FIG. 4 that show the structure of the light emitting device 100.

The method of manufacturing the light emitting device 100 includes providing a lens and disposing the lens with respect to the light emitting element that has been positioned.

The providing a lens is similar to that described in the method of manufacturing a lens and therefore the description thereof will be appropriately omitted.

Disposing Lens

In the disposing a lens, the lens 1 is disposed such that light from the light emitting element 51 is transmitted through the lens part 21 of the lens 1. In the disposing a lens, the lens 1 is disposed such that the light emitting element 51 that preferably has been mounted on the substrate 52 is accommodated the recess 4 defined by the lens part 21 and the connection part 22 and located inward of the flange part 23. The light emitting element 51 may be covered by a light-transmissive member 53.

In the disposing a lens, the light emitting element 51 is preferably mounted on a substrate 52, in which the light emitting element 51 is flip-chip mounted on the substrate 52 by using soldering. It is preferable that after the light emitting element 51 is mounted on the substrate 52, the flange parts 23 are connected to the substrate 52. In the disposing a lens, the lens 1 is disposed such that the connection part 22 and the lens part 21 of the lens 1 are spaced apart from the light emitting element 51. More specifically, a gap between the bottom surface of the recess 4 and the upper surface of the light-transmissive member 51 or the upper surface of the light-transmissive member 53 is preferably in a range of 0.05 mm to 0.5 mm. In the disposing a lens, the connection part 22 is formed such that a distance from the lens part 21 to the light emitting element 51 is smaller than a distance from the connection part 22 to the light emitting element 51. More specifically, the center (or the centroid) of the light emitting element 51 and the center (or the centroid) of the Fresnel lens 21, that is the center of ridges 21c arranged in concentric circles or concentric ellipsoids, are on the optical axis of the Fresnel lens.

Second Embodiment

Next, a second embodiment will be described with reference to FIG. 7.

Figure 7:
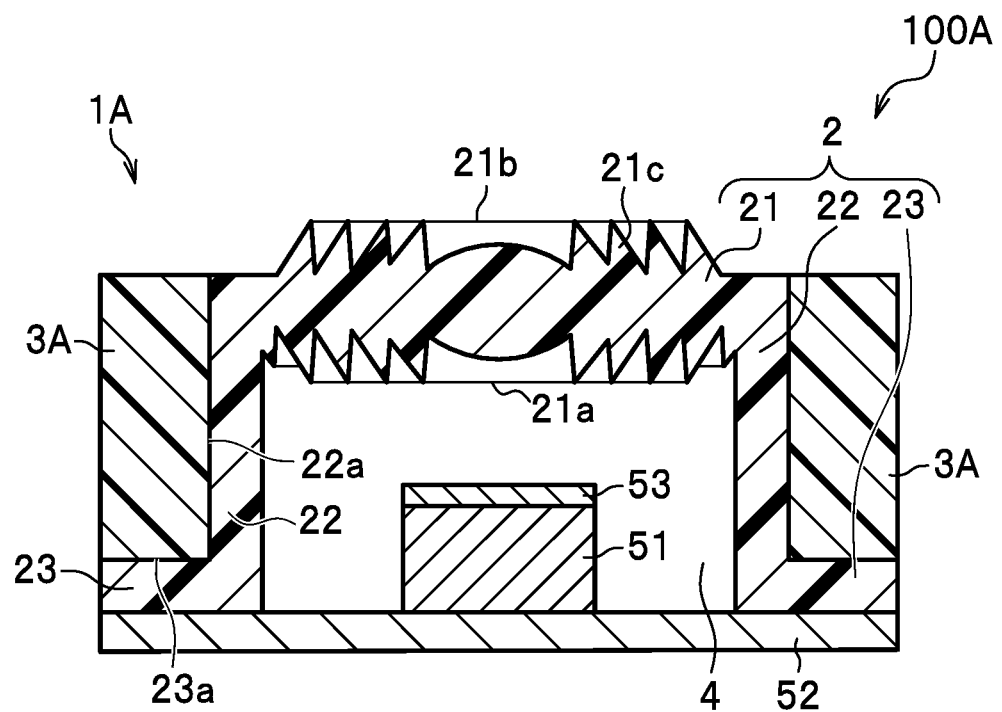
FIG. 7 is a cross-sectional view schematically showing a structure of a light emitting device that includes a lens according to a second embodiment, taken along a line passing through the center of the light emitting device.

FIG. 7 is a cross-sectional view schematically showing a structure of a light emitting device that includes a lens according to the second embodiment, in which the line is passing through the center of the light emitting device. The same reference numerals may be applied to the components that have been described above and description thereof may be appropriately omitted.

Lens and Light Emitting Device

Next, a lens 1A and a light emitting device 100A will be described.

In the lens 1A and the light emitting device 100A according to the second embodiment, a light-shielding part 3A has a larger thickness than the light-shielding part 3 of the first embodiment, and at portions having the flange parts 23, has a rectangular cross-sectional shape which is in conformity to outer lateral surfaces 22a of the lateral side walls constituted by the connection part 22. This is different from the connection part 22 of the first embodiment, which has a cross-sectional shape bent along the shapes of the outer lateral surfaces 22a of the lateral side walls constituted by the connection part 22 and the shape of the upper surfaces 23a of the flange parts 23. The structures of the lens 1A and the light emitting device 100A are similar to that of the light emitting device 100 according to the first embodiment.

The lens 1A and the light emitting device 100A according to the second embodiment having the light-shielding part 3A with a large thickness can yield a further reduction of leaking light.

Method of Manufacturing Lens

Next, a method of manufacturing the lens 1A will be described.

Figure 8A:
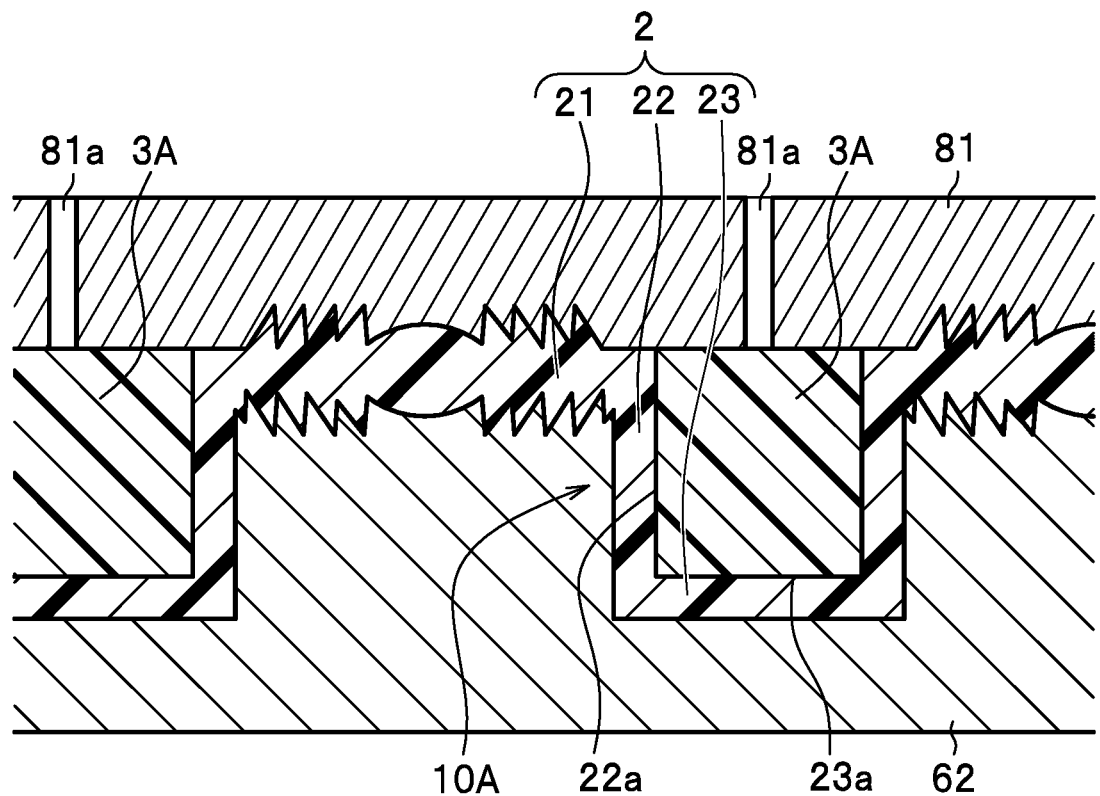
FIG. 8A is a cross-sectional view schematically illustrating arranging a cover blank in a second mold to form a lens blank in a method of manufacturing a lens according to the second embodiment.
Figure 8B:
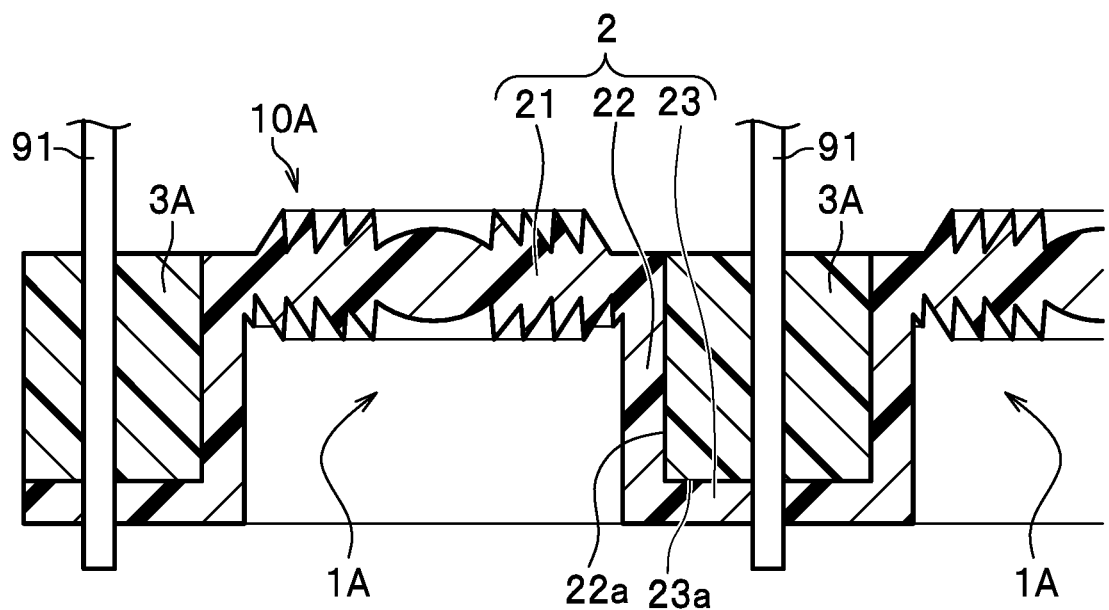
FIG. 8B is a cross-sectional view schematically illustrating cutting the lens blank into individual lenses in a method of manufacturing a lens according to the second embodiment.

FIG. 8A is a cross-sectional view schematically illustrating arranging a cover blank in a second mold and forming a cover blank in a method of manufacturing a lens according to the second embodiment. FIG. 8B is a cross-sectional view schematically illustrating cutting a lens blank into individual lenses in a method of manufacturing a lens according to the second embodiment.

The method of manufacturing a lens 1A includes, similar to the method of manufacturing a lens according to the first embodiment, forming (S1) a cover blank, removing (S2) a first mold, arranging (S3) the cover blank in a second mold, forming (S4) a lens blank, and obtaining (S5) individual lenses, which are performed in this order.

The method of manufacturing the lens 1A can be performed in a similar manner as in the method of manufacturing the lens 1 according to the first embodiment, except that in the arranging (S3) the cover blank 20 in the second mold, the cover blank 20 is arranged in a second mold (an upper mold 81 and the lower mold 62) that is different from the second mold (the upper mold 71 and the lower mold 62). In the forming (S4) a lens blank 10A, a thermosetting second resin having a greater light-absorptance or a greater light-reflectance than the thermosetting first resin is injected in the second mold and cured, to form a lens blank 10A having a light-shielding part 3A in a rectangular shape in a cross section, which is in conformity to the shape of the outer lateral surface 22a of the lateral side walls constituted by the connection part 22, disposed between adjacent cover parts 2. Further, in the obtaining (S5) individual lenses 1A, a center of the light-shielding part 3A between outer lateral surfaces 22a of two adjacent connection parts 22 of the lens blank 10A is cut together with the flange part 23 to obtain individual lens 1A having the outer lateral surfaces 22a of the lateral side walls constituted by the connection part 22 and the lateral end surfaces 23a and the upper surface 23a of the flange part 23 covered by the light-shielding part 3A. In a cross-section, the light-shielding part 3A of each of the individual lenses 1A has a rectangular shape in conformity to the shapes of the outer lateral surfaces 22a of the side walls constituted by the connection part 22.

Method of Manufacturing Light Emitting Device

Next, a method of manufacturing a light emitting device 100A will be described.

The method of manufacturing the light emitting device 100A includes providing a lens and disposing the lens with respect to the light emitting element that has been positioned. The method of manufacturing the light emitting device 100A can be performed in a similar manner as in the method of manufacturing the light emitting device 100 according to the first embodiment, except for using the lens 1A.

Third Embodiment

Next, a third embodiment will be described with reference to FIG. 9.

Figure 9:
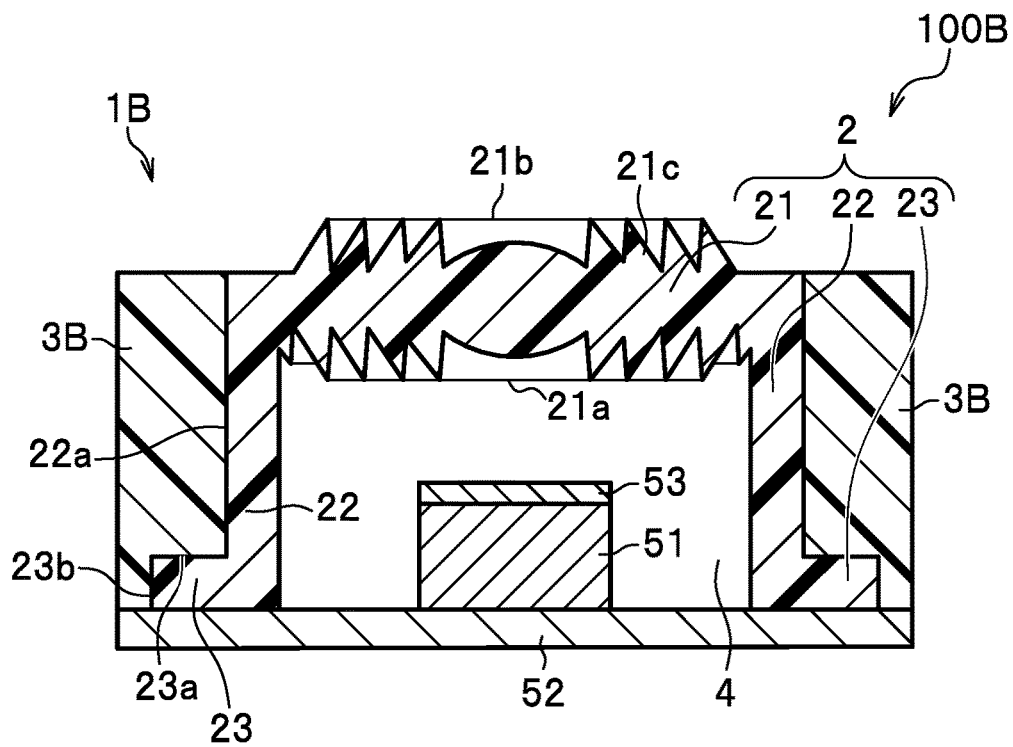
FIG. 9 is a cross-sectional view schematically showing a structure of a light emitting device that includes a lens according to a third embodiment, taken along a line passing through the center of the light emitting device.

FIG. 9 is a cross-sectional view schematically showing a structure of a light emitting device that includes a lens according to a third embodiment, taken along a line passing through the center of the light emitting device. In the description below, the same reference numerals will be applied to the structure of the light emitting device 100 and description thereof will be appropriately omitted.

Lens and Light Emitting Device

A lens and a light emitting device 100B will be described below.

In the lens 1B and the light emitting device 100B according to the third embodiment, a light-shielding part 3B has a thickness further greater than that of the light-shielding part 3A of the second embodiment, and covers lateral end surfaces 23b of the flange parts 23. Other structures of the lens 1B and the light emitting device 100B can be similar to those in the lens 1A and the light emitting device 100A according to the second embodiment.

The lens 1B and the light emitting device 100B according to the third embodiment having the light-shielding part 3B of a large thickness covering the outer lateral end surfaces 23b can yield a further reduction of leaking light through the light-shielding part 3B.

Method of Manufacturing Lens

Next, a method of manufacturing a lens 1B will be described.

Figure 10:
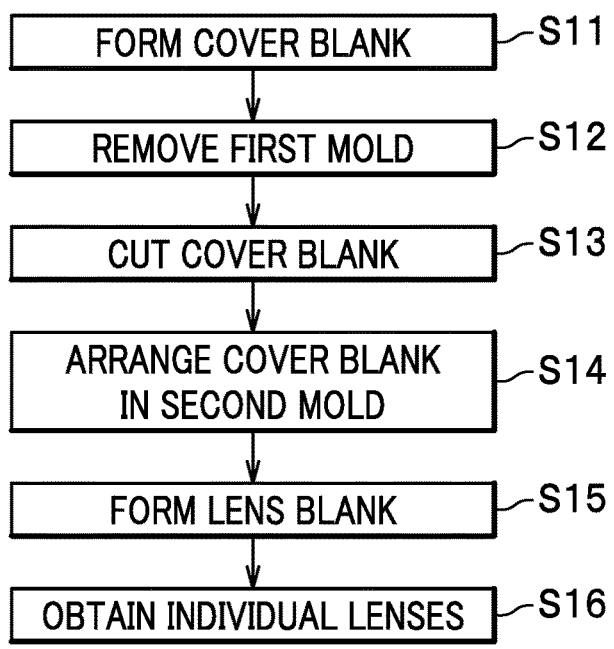
FIG. 10 is a flow chart showing a flow of a method of manufacturing a lens according to the third embodiment.
Figure 11A:
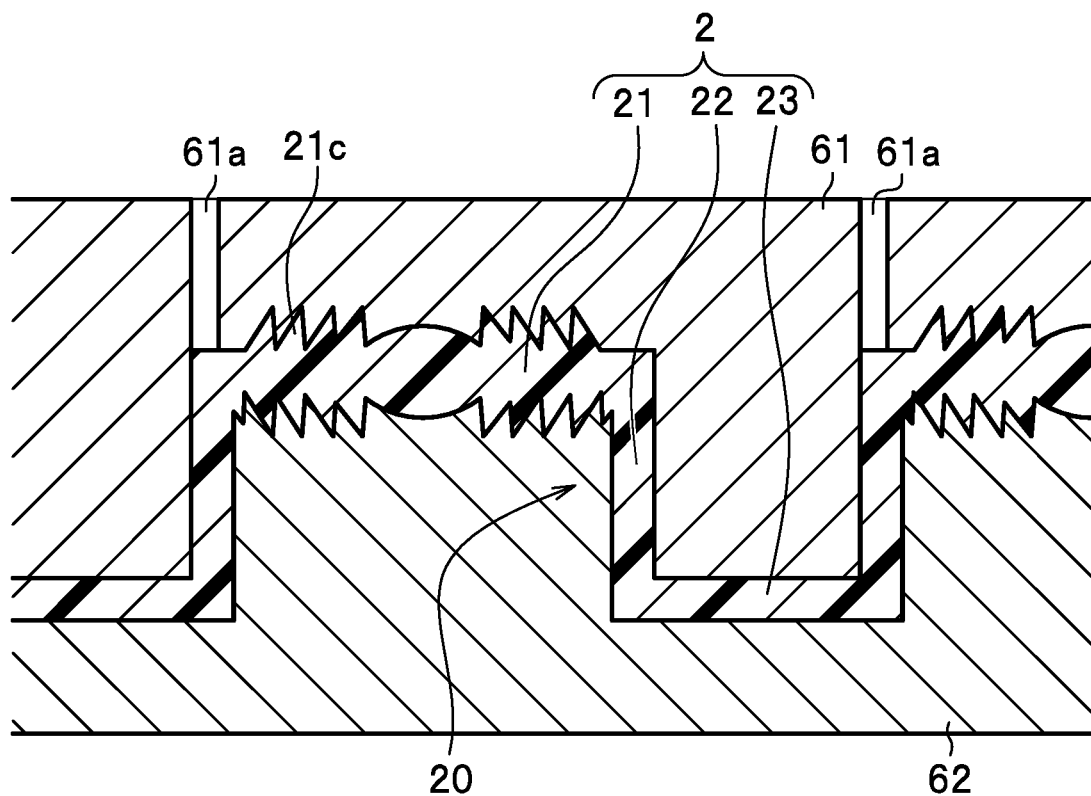
FIG. 11A is a cross-sectional view schematically illustrating forming a cover blank in a method of manufacturing a lens according to the third embodiment.
Figure 11B:
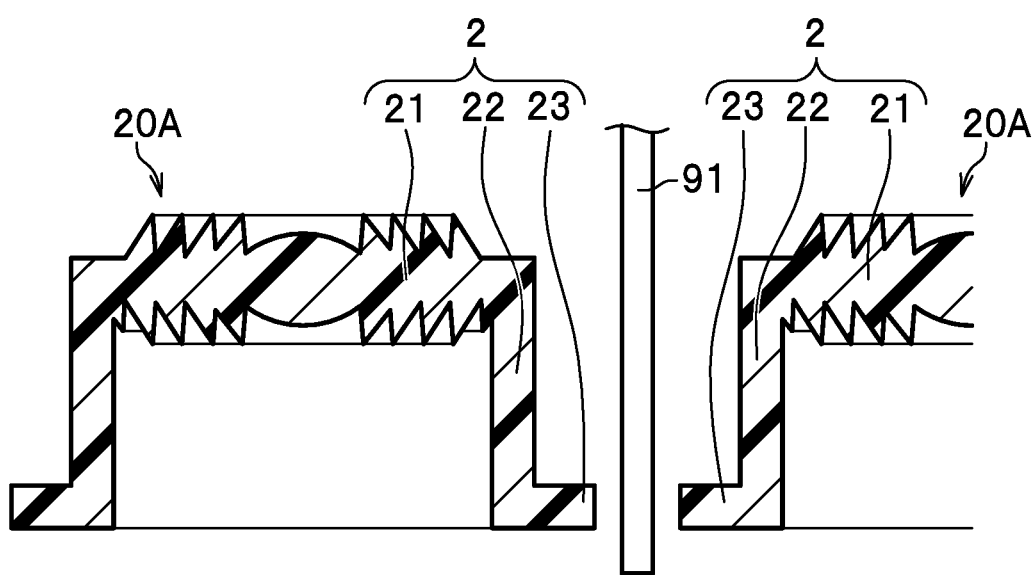
FIG. 11B is a cross-sectional view schematically illustrating cutting a cover blank in a method of manufacturing a lens according to the third embodiment.
Figure 11C:
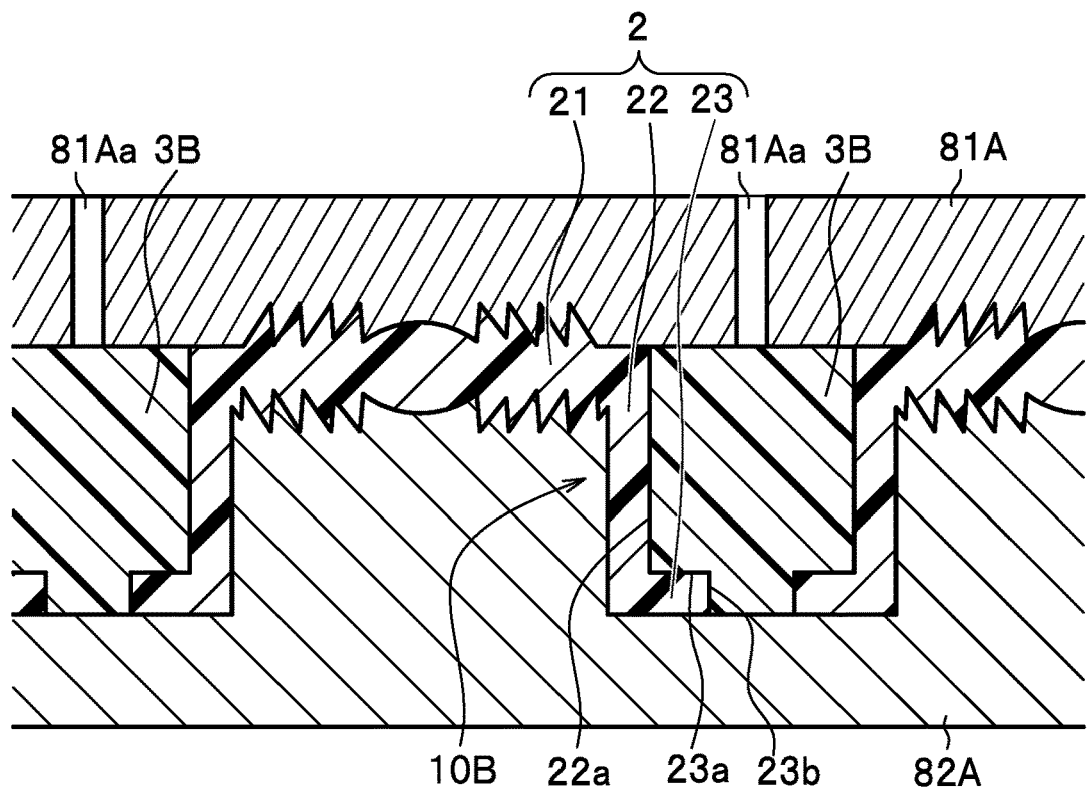
FIG. 11C is a cross-sectional view schematically illustrating of arranging a cut cover blank in a second mold and forming a lens blank in a method of manufacturing a lens according to the third embodiment.
Figure 11D:
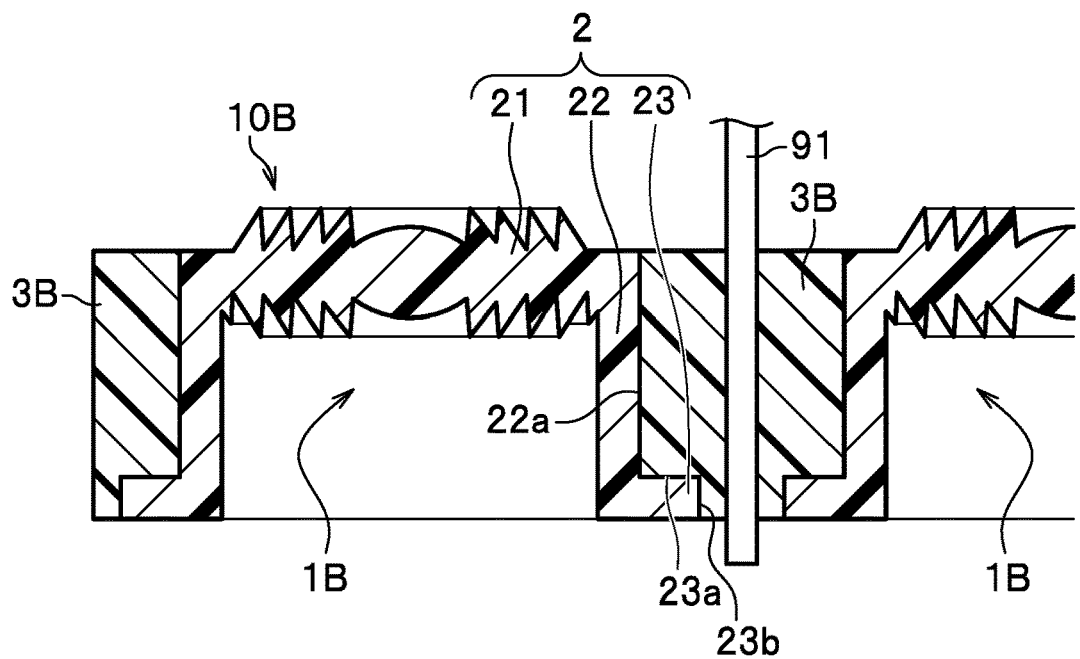
FIG. 11D is a cross-sectional view schematically illustrating cutting a lens blank into individual lenses in a method of manufacturing a lens according to the third embodiment.

FIG. 10 is a flow chart showing a procedure of a method of manufacturing a lens according to the third embodiment. FIG. 11A is a cross-sectional view schematically illustrating forming a cover blank in a method of manufacturing a lens according to the third embodiment. FIG. 11B is a cross-sectional view schematically illustrating cutting a cover blank in a method of manufacturing a lens according to the third embodiment. FIG. 11C is a cross-sectional view schematically illustrating arranging a cut cover blank in a second mold and forming a lens blank in a method of manufacturing a lens according to the third embodiment. FIG. 11D is a cross-sectional view schematically illustrating cutting a lens blank into individual lenses in a method of manufacturing a lens according to the third embodiment.

The method of manufacturing a lens 1B includes, forming (S11) a cover blank, removing (S12) a first mold, cutting (S13) the cover blank, arranging (S14) the cover blank in a second mold, forming (S15) a lens blank, and obtaining (S16) individual lenses, which are performed in this order. With the method of manufacturing described above, a lens 1B yielding a reduction of leaking light can be produced.

The materials and the arrangements of the members are similar to those described for the lens 1B and therefore the description thereof will be appropriately omitted.

Forming Cover Blank

As shown in FIG. 11A, in the forming (S11) a cover blank, a thermosetting first resin is injected in a first mold to form a cover blank 20 having a plurality of cover parts 2 each having a lens part 21 having a plurality of lateral sides, a connection part 22 constituting a plurality of lateral side walls each extending downward from a respective one of the lateral sides of the lens part 21 and having a plurality of outer lateral sides, and a plurality of flange parts 23 each extending outward from a lower-end portion of a corresponding one of the plurality of lateral side walls constituted by the connection part 22. The lens part 21, the connection part 22, and the flange parts 23 are formed continuous with one another.

In the forming (S11) a cover blank, an upper mold 61 and a lower mold adapted for transfer molding are employed as a first mold. The upper mold 61 and the lower mold are closed, and the thermosetting first resin, which is heated and softened, is injected under pressure into the first mold through a resin injecting port 61a formed in the upper mold 61. The thermosetting first resin is cured in the heated mold, such that a cover blank 20 having a plurality of cover parts 2 connected one another at the flange parts 23 is molded.

In the forming (S11) the cover blank, the upper mold 61 and the lower mold 62 are designed to produce a cover blank 20 having a plurality of cover parts 2, a respective one of the cover parts 2 being formed with a recess defined by the lens part 21 and the connection part 22 and located inward of the plurality of flange parts 23. Each of the lens parts 21 of the cover blank 20 has a plurality of ridges 21c at both upper and lower sides. In the forming (S11) a cover blank, the upper mold 61 and the lower mold 62 are designed to produce a cover blank 20 having a plurality of cover parts 2 each including the plurality of flange parts 23 having a thickness in a range of 5 μm to 30 μm.

Removing First Mold

In the removing (S12) the first mold, the first mold is removed after the cover blank 20 is formed. In the removing (S12) the first mold, all parts (the upper mold 61 and the lower mold 62) of the first mold are removed.

Cutting Cover Blank

As shown in FIG. 11B, in the cutting (S13) the cover blank, the cover blank 20 is divided at the flange part 23 between adjacent cover parts 2 to obtain individual cover blanks 20A. Cutting of the cover blank 20 can be performed by using a cutting tool 91 such as a known blade or the like. It is preferable to adjust the cutting width of the cutting tool 91 such that the flange parts 23 of the individual cover blank 20A have a length in a range of 200 μm to 3,000 μm.

Arranging Cover Blank in Second Mold

In the arranging (S14) the cover blank in the second mold, cut cover blank 20 (singulated cover blank 20A) is arranged in another an upper mold 81A and a lower mold 82A also adapted for transfer molding.

Forming Lens Blank

In the forming (S15) a lens blank, the upper mold 81A and the lower mold 82A are closed, and the thermosetting second resin, which is heated and softened, is injected under pressure into the second mold through a resin injecting port 81Aa formed in the upper mold 81A.

In the forming (S15) a lens blank, the upper mold 81A and the lower mold 82A are engaged and a heat-softened second resin is injected through a resin injecting port 81Aa provided in the upper mold 81A under pressure. The heat-softened second resin is cured in the heated mold, such that a lens blank 10B having a light-shielding part 3B between adjacent cover parts 2, in a rectangular shape in a cross-section that is in conformity to the shape of the outer lateral surface 22a of the side walls constituted by the connection part 22 and covering the lateral end surfaces 23c and the outer end surface 23b of each of the flange part 23 is molded. At least a portion of the lateral end surfaces 23c of the flange part 23 are covered by the light-shielding part 3B, but preferably, all portions of the lateral end surfaces 23c of the flange part 23 are covered by the light-shielding part 3B.

Obtaining Individual Lenses

As shown in FIG. 11D, in the obtaining (S16) individual lenses, the lens blank 10B is singulated into individual lenses 1B. That is, in the obtaining (S16) individual lenses, all parts of the second mold are removed to take out the lens blank 10B, and the lens blank 10B is cut along a center of the light-shielding part 3B between adjacent cover parts 2. The cutting is performed at the light-shielding part 3B to obtain individual lenses 1B each having the light-shielding part 3B covering the lateral end surfaces 23c and the upper surface 23a of each of the flange parts 23, and the outer lateral surfaces 22a of the side walls constituted by the connection part 22, as well as the outer end surface 23b of each of the flange parts 23.

In the obtaining (S16) individual lenses, the lens blank 10B is cut along the center of the light-shielding part 3B between the outer lateral surfaces 22a of adjacent connection parts 22 and between outer end surfaces 23b of adjacent flange parts 23, to obtain individual lenses 1B each having the light-shielding part 3 covering the outer lateral surfaces 22a of the side walls constituted by the connection part 22, the upper surfaces 23a of the flange parts 23, and the outer end surfaces of the flange parts 23. In a cross-section, the light-shielding part 3B of each of the individual lenses 1B has a rectangular shape in conformity to the shapes of the outer lateral surfaces 22a of the side walls constituted by the connection part 22 and covering the outer end surfaces 23b of the flange parts 23. Cutting of the light-shielding part 3B can be performed by using a cutting tool 91 such as a known blade or the like.

Method of Manufacturing Light Emitting Device

Next, a method of manufacturing a light emitting device 100B will be described.

The method of manufacturing the light emitting device 100B includes providing a lens and disposing the lens with respect to the light emitting element that has been positioned. The method of manufacturing the light emitting device 100B can be performed in a similar manner as in the method of manufacturing the light emitting device 100 according to the first embodiment, except for using the lens 1B.

Fourth Embodiment

Figure 13:
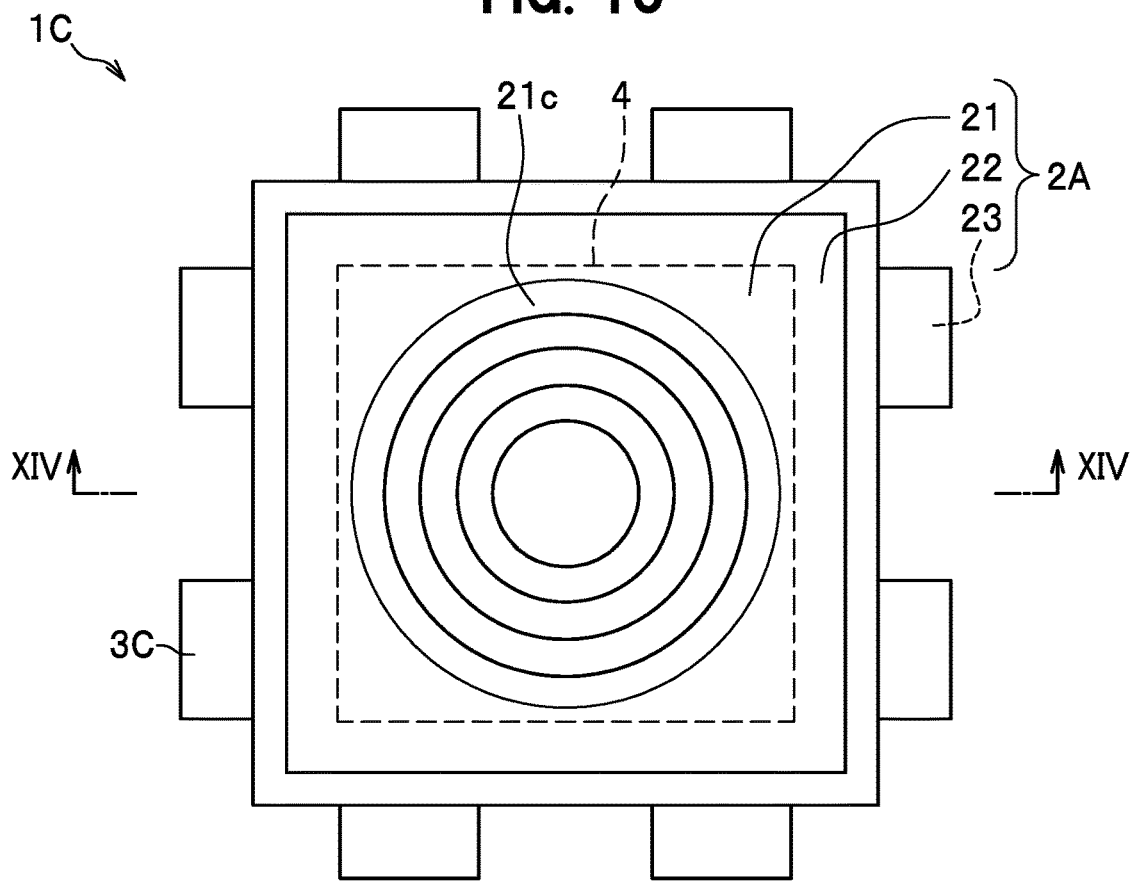
FIG. 13 is a plan view schematically showing a structure of a lens according to the fourth embodiment.
Figure 14:
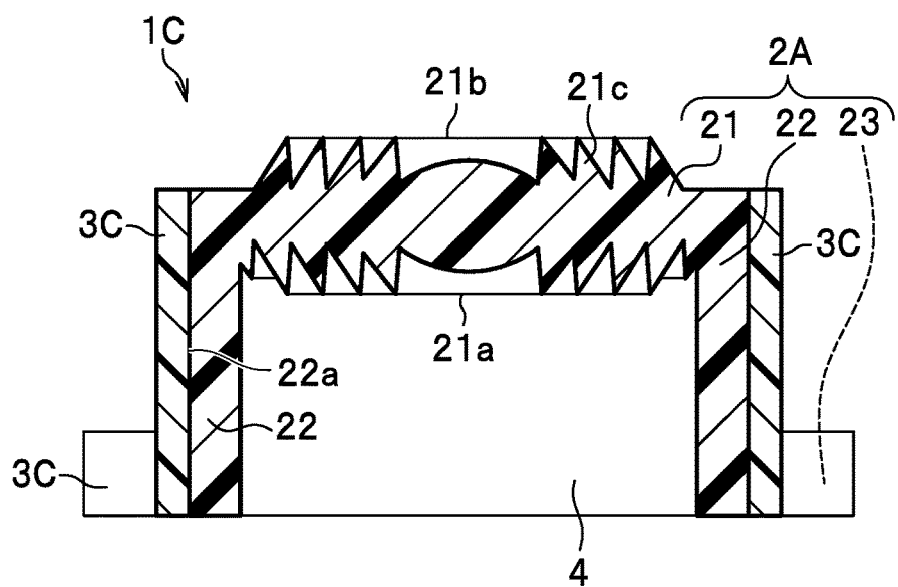
FIG. 14 is a cross-sectional view, taken along line XIV-XIV of FIG. 13, schematically showing a structure of a lens according to the fourth embodiment, in which the line is passing through the center of the lens.

Next, a fourth embodiment will be described with reference to FIG. 12 to FIG. 14.

Figure 12:
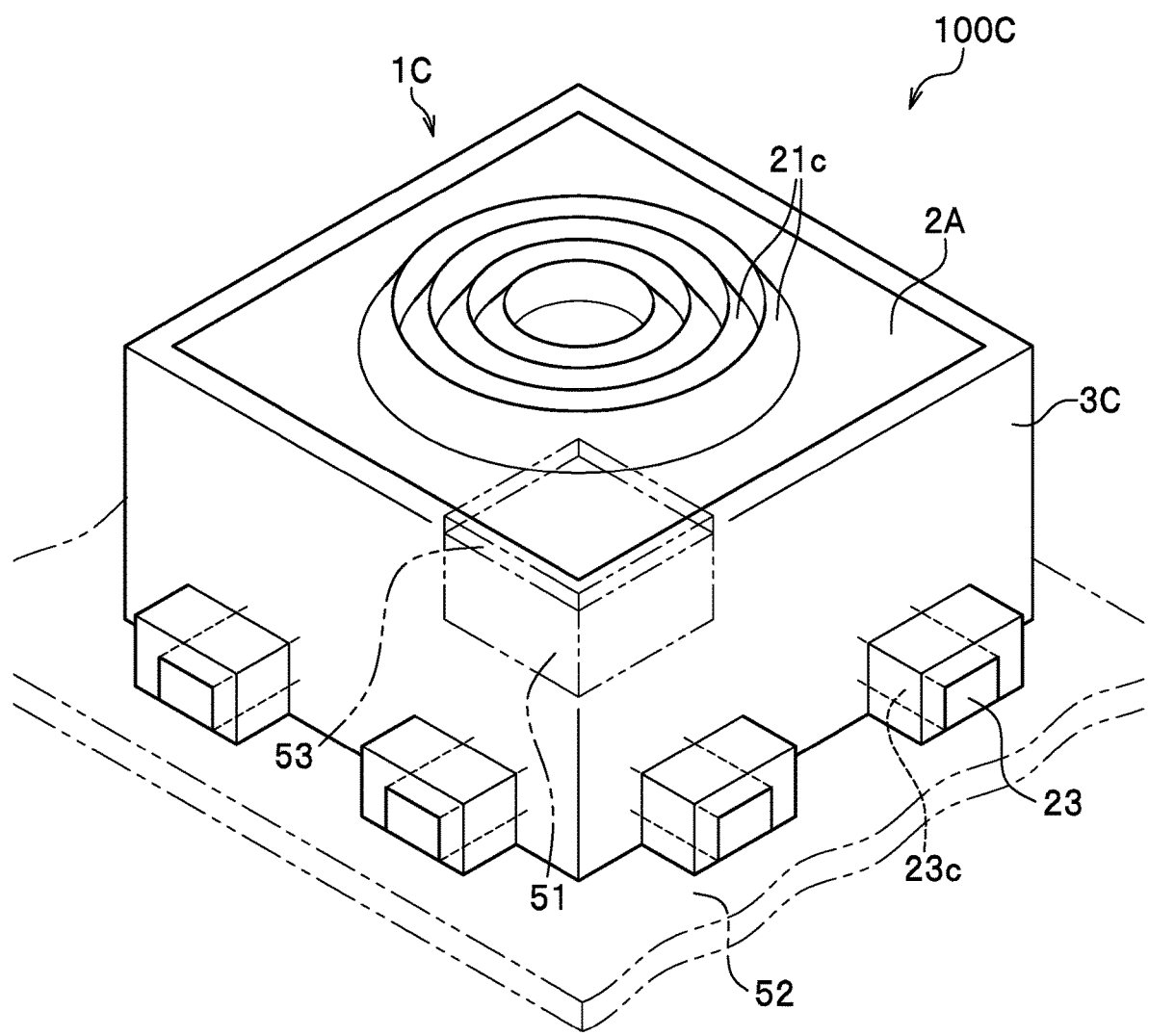
FIG. 12 is a perspective view schematically showing a structure of a light emitting device that includes a lens according to a fourth embodiment.

FIG. 12 is a perspective view schematically showing a structure of a light emitting device that includes a lens according to a fourth embodiment. FIG. 13 is a plan view schematically showing a structure of a lens according to the fourth embodiment. FIG. 14 is a cross-sectional view, taken along line XIV-XIV of FIG. 13, schematically showing a structure of a lens according to the fourth embodiment, in which the line is passing through the center of the lens. In the description below, the same reference numerals will be applied to the members that have already been described, and description thereof will be appropriately omitted.

Lens and Light Emitting Device

Next, a lens 1C and a light emitting device 100C will be described.

The lens 1C and the light emitting device 100C according to the fourth embodiment have structures similar to those of the lens 1 and the light emitting device 100 according to the first embodiment, except that two of the flange parts 23 are disposed on a single outer lateral surface of the connection part 22, such that a total of eight flange parts 23 are disposed on the outer periphery of the connection part 22. The flange parts 23 disposed on a single lateral surface of the connection part 22 are spaced apart from each other.

The lens 1C and the light emitting device 100C according to the fourth embodiment having structures described above can yield more stable connection and bonding with the substrate 52.

Method of Manufacturing

Next, a method of manufacturing a lens 1C will be described.

The method of manufacturing the lens 1C includes, similar to the method of manufacturing a lens according to the first embodiment, forming (S1) a cover blank, removing (S2) a first mold, arranging (S3) the cover blank in a second mold, forming (S4) a lens blank, and obtaining (S5) individual lenses, which are performed in this order.

The method of manufacturing the lens 1C is similar to the method of manufacturing the lens 1 according to the first embodiment, except that in the forming a cover blank, a cover blank 20 having a plurality of cover parts 2 each having two flange part 23 on each of a single outer lateral surfaces of the connection part 22 is formed.

Method of Manufacturing Light Emitting Device

Next, a method of manufacturing a light emitting device 100C will be described.

The method of manufacturing the light emitting device 100C includes providing a lens and disposing the lens with respect to the light emitting element that has been positioned. The method of manufacturing the light emitting device 100C can be performed in a similar manner as in the method of manufacturing the light emitting device 100 according to the first embodiment, except for using the lens 1C.

The lens 1C and the light emitting device 100C may include the light-shielding part 3C having a large thickness, by appropriately applying the method of manufacturing the lens 1A and the light emitting device 100A according to the second embodiment.

Alternatively, the lens 1C and the light emitting device 100C may include the flange parts 23 having the outer end surfaces 23b covered by the light-shielding part 3B, by appropriately applying the method of manufacturing the lens 1A and the light emitting device 100A according to the second embodiment.

In the fourth embodiment, two of the flange parts 23 are disposed on each of the plurality of outer lateral surfaces of the connection part 22, but three or more of the flange parts 23 may be disposed on each of the plurality of outer lateral surfaces of the connection part 22.

Fifth Embodiment

Figure 16:
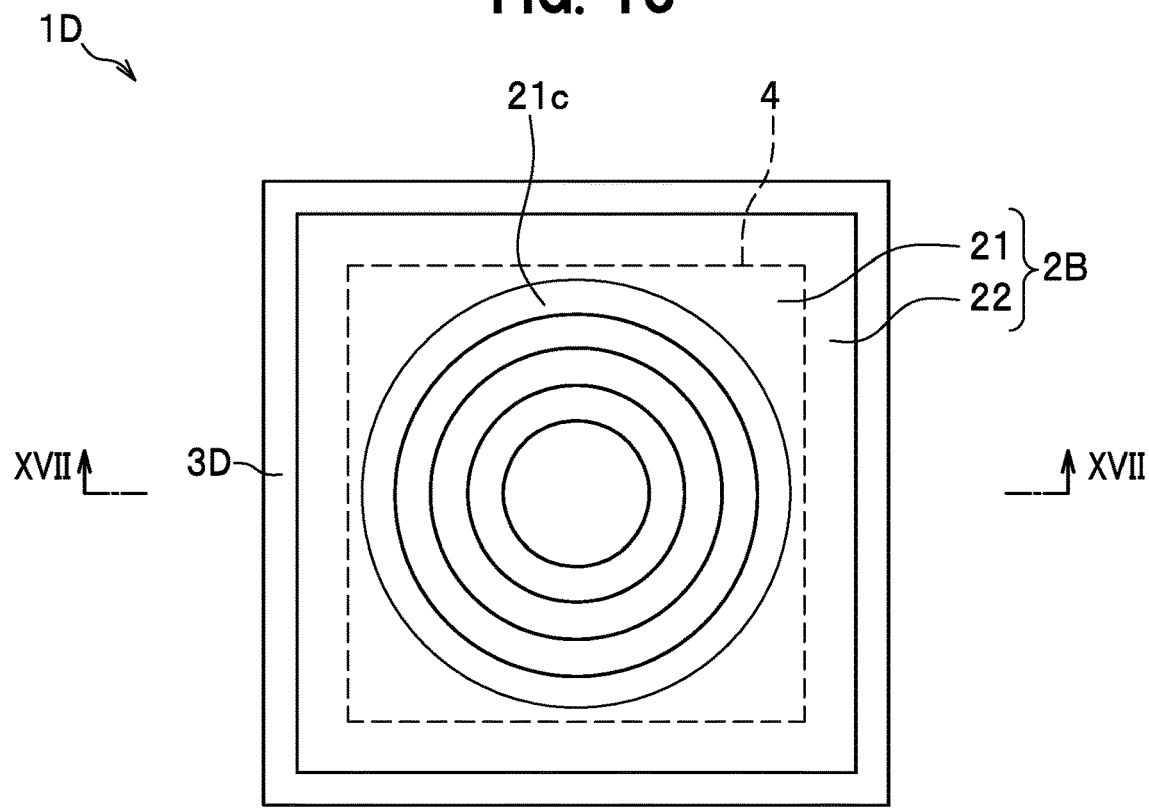
FIG. 16 is a plan view schematically showing a structure of a lens according to the fifth embodiment.
Figure 17:
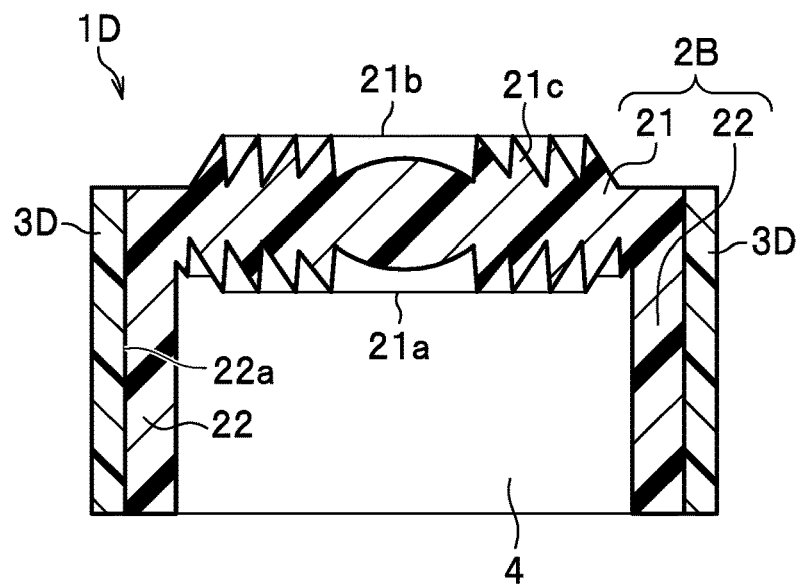
FIG. 17 is a cross-sectional view, taken along line XVII-XVII of FIG. 16, schematically showing a structure of a lens according to the fifth embodiment, in which the line is passing through the center of the lens.

Next, a fifth embodiment will be described with reference to FIG. 15 to FIG. 17.

Figure 15:
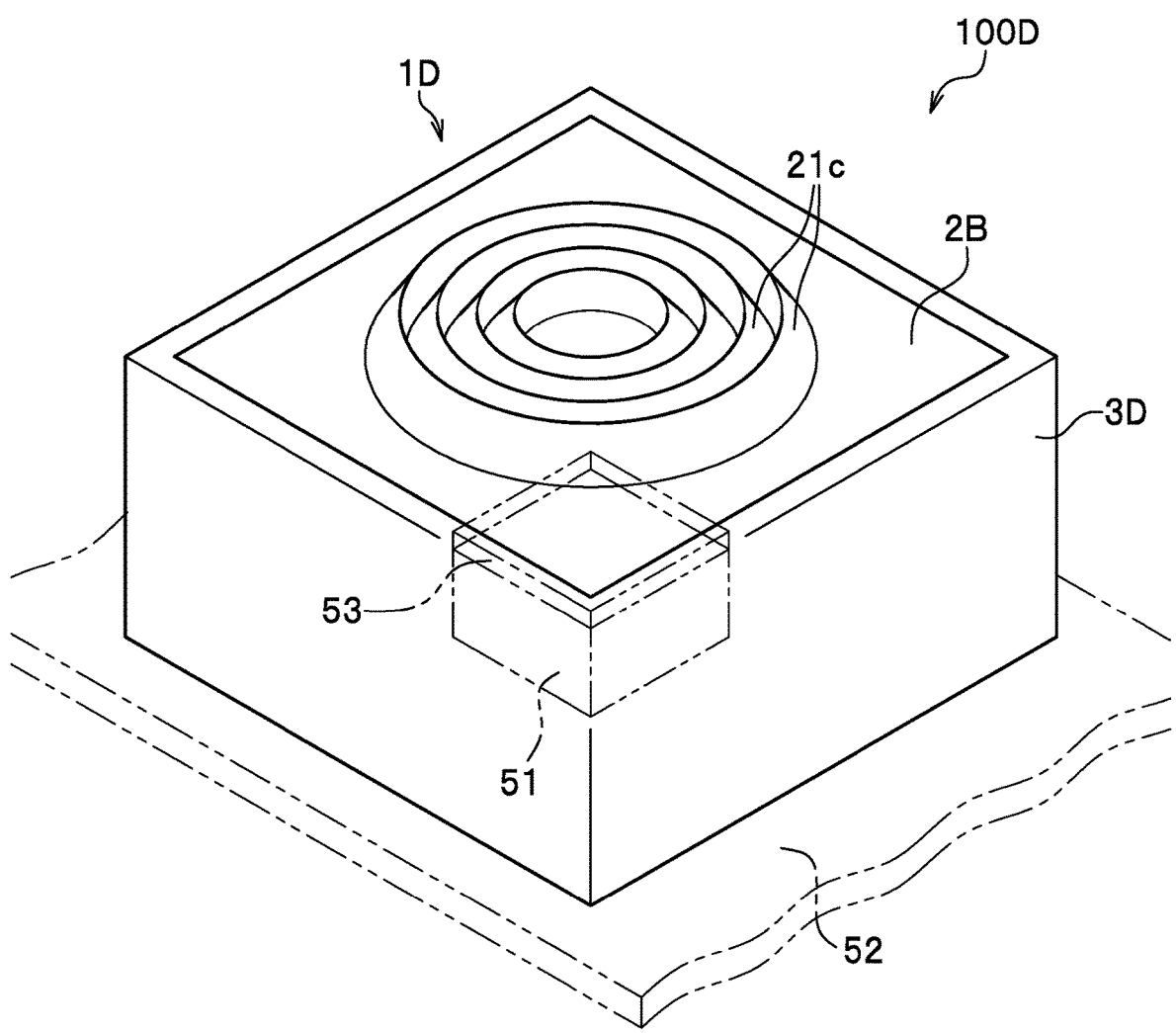
FIG. 15 is a perspective view schematically showing a structure of a light emitting device that includes a lens according to a fifth embodiment.

FIG. 15 is a perspective view schematically showing a structure of a light emitting device that includes a lens according to a fifth embodiment. FIG. 16 is a plan view schematically showing a structure of a lens according to the fifth embodiment. FIG. 17 is a cross-sectional view, taken along line XVII-XVII of FIG. 16, schematically showing a structure of a lens according to the fifth embodiment, in which the line is passing through the center of the lens. In the description below, the same reference numerals will be applied to the members that have already described, and description thereof will be appropriately omitted.

Light Lens and the Emitting Device

Next, a lens 1D and a light emitting device 100D according to the fifth embodiment will be described.

The lens 1D and the light emitting device 100D are not provided with a flange part. Other structures are similar to those of the light emitting device 100 according to the first embodiment. When the substrate 52 is included in the light emitting device 100D, the connection part 22 of the lens 1D is connected to the substrate 52.

The lens 1D and the light emitting device 100D according to the fifth embodiment do not have a flange part, which allows for further reduction of leaking light.

Method of Manufacturing Lens

Next, a method of manufacturing a lens 1D according to the fifth embodiment will be described.

Figure 18A:
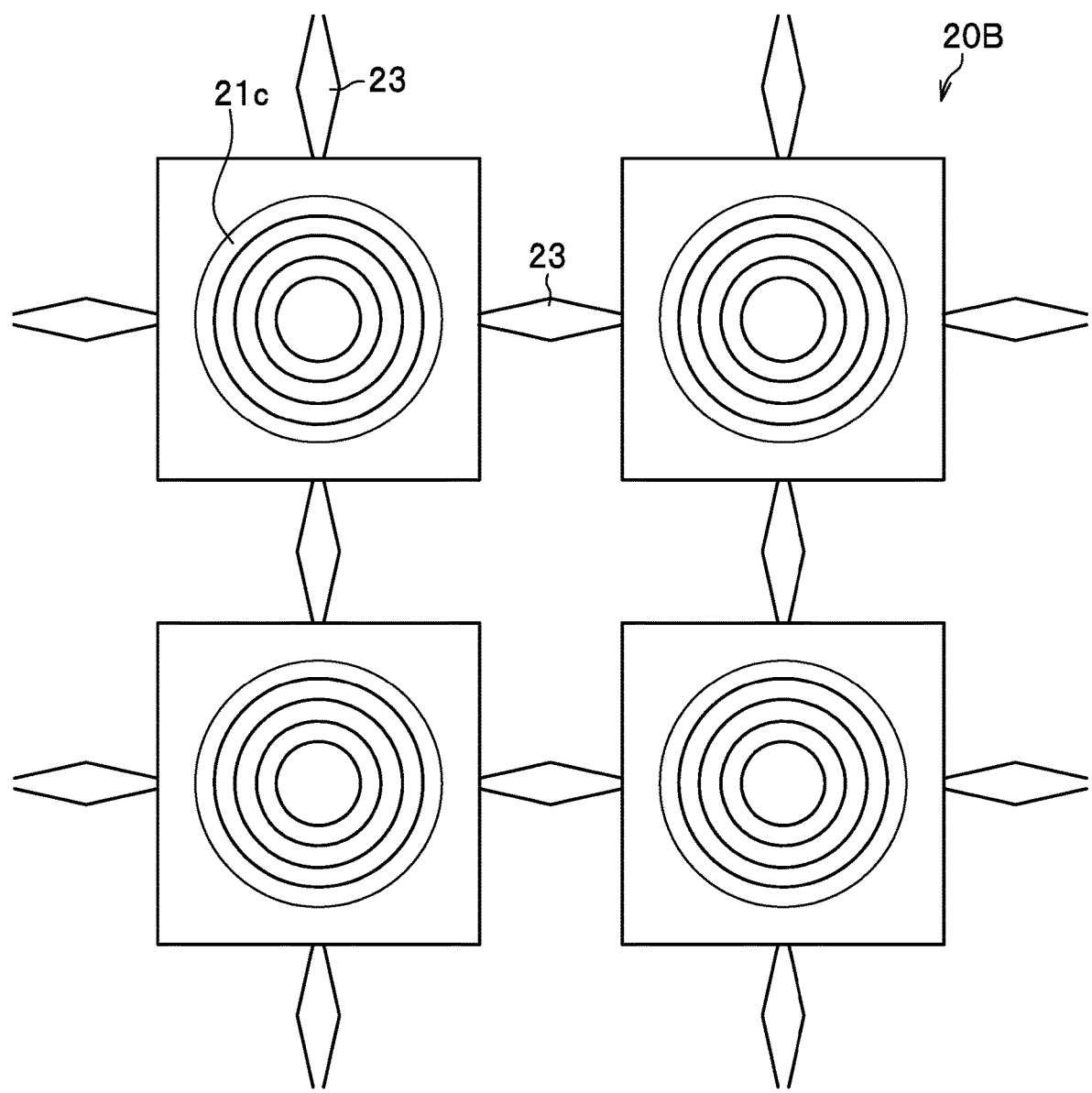
FIG. 18A is a plan view schematically showing a structure of a cover blank of a lens according to the fifth embodiment.
Figure 18B:
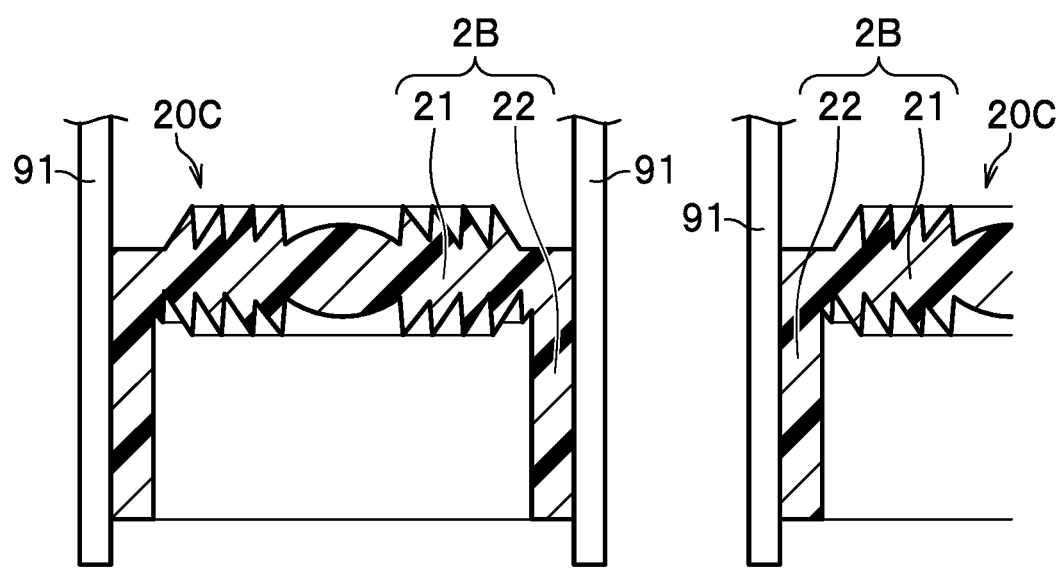
FIG. 18B is a cross-sectional view schematically illustrating forming a cover blank in a method of manufacturing a lens according to the fifth embodiment.
Figure 18C:
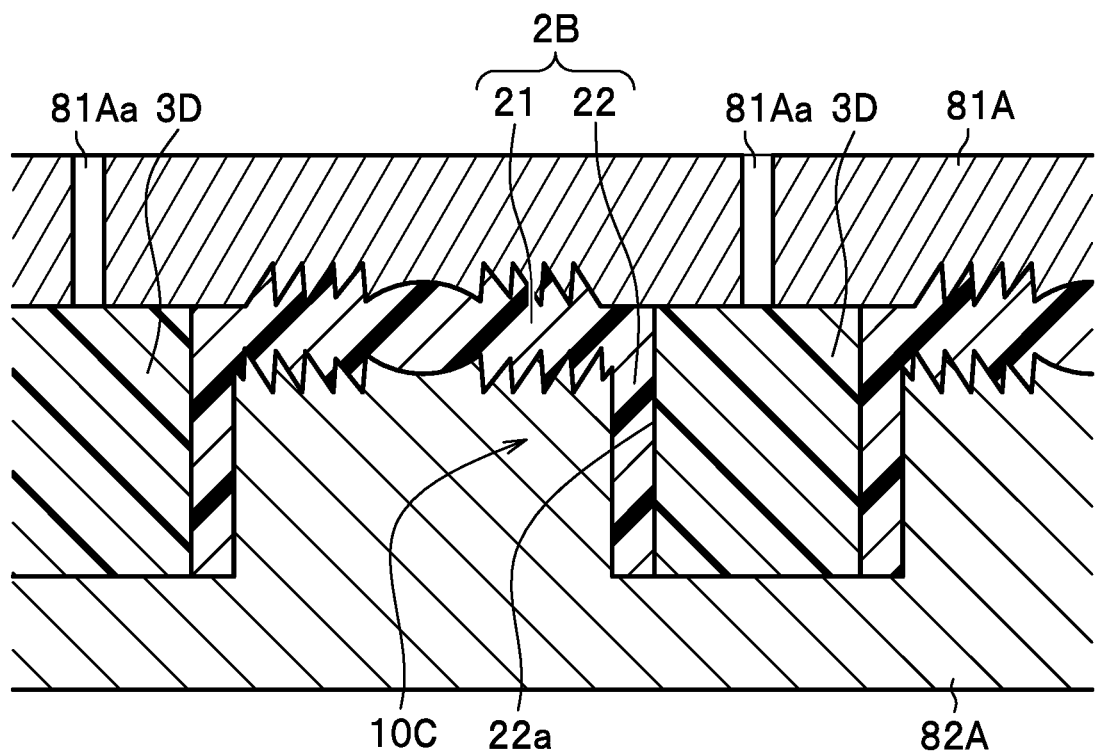
FIG. 18C is a cross-sectional view schematically illustrating arranging a cut cover blank in a second mold and forming a lens blank in a method of manufacturing a lens according to the fifth embodiment.
Figure 18D:
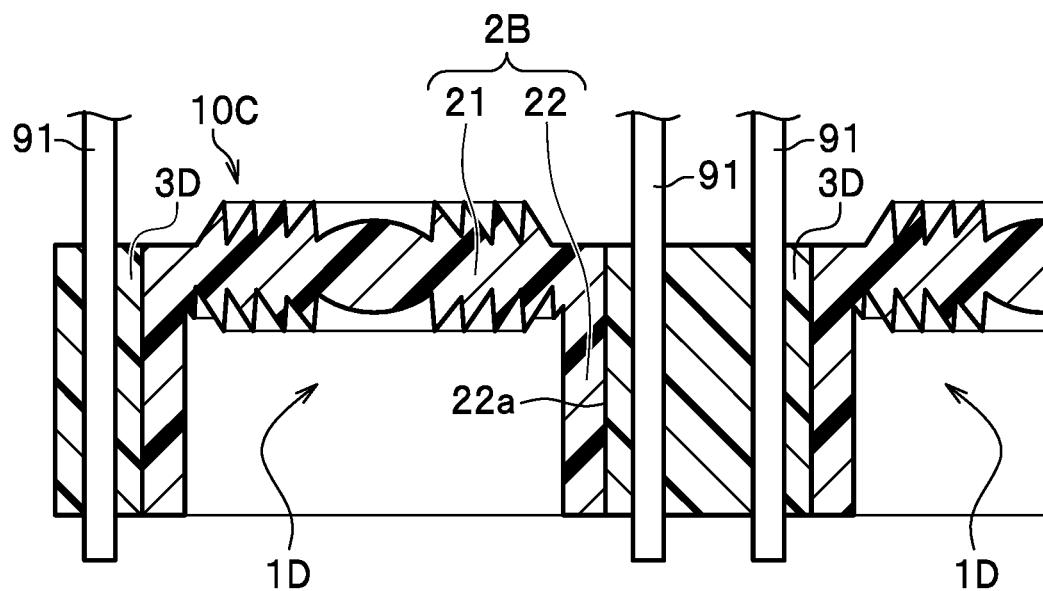
FIG. 18D is a cross-sectional view schematically illustrating cutting a lens blank into individual lenses in a method of manufacturing a lens according to the fifth embodiment.

FIG. 18A is a plan view schematically showing a structure of a cover blank of a lens according to the fifth embodiment. FIG. 18B is a cross-sectional view schematically illustrating forming the cover blank in a method of manufacturing a lens according to the fifth embodiment. FIG. 18C is a cross-sectional view schematically illustrating arranging a cut cover blank in a second mold and forming a lens blank in a method of manufacturing a lens according to the fifth embodiment. FIG. 18D is a cross-sectional view schematically illustrating cutting a lens blank to obtain individual lenses in a method of manufacturing a lens according to the fifth embodiment.

The method of manufacturing a lens 1D includes, similar to the method of manufacturing a lens according to the third embodiment, forming (S11) a cover blank, removing (S12) a first mold, cutting (S13) the cover blank, arranging (S14) the cover blank in a second mold, forming (S15) a lens blank, and obtaining (S16) individual lenses, which are performed in this order. With the method of manufacturing described above, a lens 1D yielding a reduction of leaking light can be produced.

The method of manufacturing a lens 1D is similar to the method of manufacturing a lens 1B according to the third embodiment except that in the forming (S11) a cover blank, a cover blank 20B having flange parts 23 with a width smaller at the connection part 22 side, for example, a diamond shape in a top plan view, as shown in FIG. 18A is formed. As shown in FIG. 18B, in the cutting (S13) the cover blank, the cover blank 20B is cut between adjacent cover parts 2 at the flange part 23 and along the outer edge of the connection part to obtain individual cover blanks 20C that do not have the flange parts. Further, in the obtaining (S16) individual lenses 1D, the light-shielding part 3D between outer lateral surfaces 22a of two adjacent connection parts 22 of the lens blank 10C is cut at a predetermined thickness to obtain individual lens 1D having the outer lateral surfaces 22a of the side walls constituted by the connection part 22 covered by the light-shielding part 3D that has the predetermined thickness.

Method of Manufacturing Light Emitting Device

Next, a method of manufacturing a light emitting device 100D according to the fifth embodiment will be described.

The method of manufacturing the light emitting device 100D includes providing a lens and disposing the lens with respect to the light emitting element that has been positioned, which are performed in this order. The method of manufacturing the light emitting device 100D can be performed in a similar manner as in the method of manufacturing the light emitting device 100 according to the first embodiment, except for using the lens 1D. When the substrate 52 is included in the light emitting device 100D, the connection part 22 of the lens 1D is connected to the substrate 52.

Sixth Embodiment

Next, a sixth embodiment will be described with reference to FIG. 19.

Figure 19:
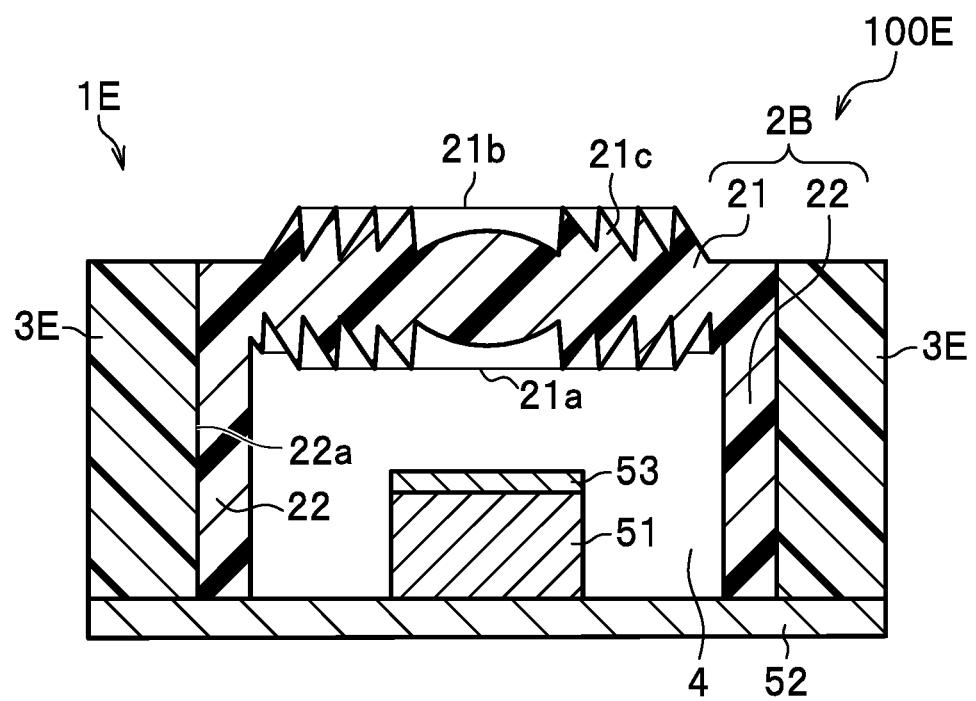
FIG. 19 is a cross-sectional view schematically showing a structure of a light emitting device that includes a lens according to a sixth embodiment, taken along a line passing through the center of the light emitting device.

FIG. 19 is a cross-sectional view schematically showing a structure of a light emitting device that includes a lens according to a sixth embodiment, taken along a line passing through the center of the light emitting device. In the description below, the same reference numerals will be applied to the structures that have been described above.

Lens and Light Emitting Device

Next, a lens 1E and a light emitting device 100E will be described.

In the lens 1E and the light emitting device 100E according to the sixth embodiment, a light-shielding part 3E is formed in a frame shape having a thickness greater than the light-shielding part 3 according to the first embodiment. Other structures are similar to that of the lens 1D and the light emitting device 100D according to the fifth embodiment.

With the lens 1E and the light emitting device 100E having the light-shielding part 3E with a large thickness according to the sixth embodiment, leaking of light can be further reduced.

Method of Manufacturing

Next, a method of manufacturing a light lens 1E will be described.

Figure 20:
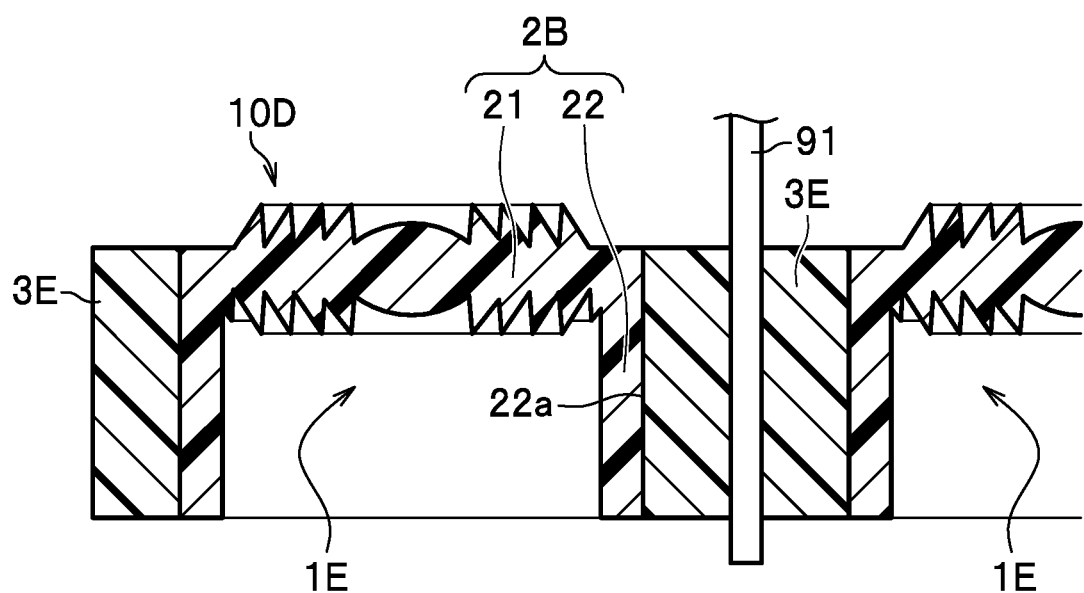
FIG. 20 is a cross-sectional view schematically illustrating cutting a lens blank into individual lenses in a method of manufacturing a lens according to the sixth embodiment.

FIG. 20 is a cross-sectional view schematically illustrating cutting a lens blank into individual lenses in a method of manufacturing a lens according to the sixth embodiment.

The method of manufacturing a lens 1E includes, similar to the method of manufacturing a lens according to the fifth embodiment, forming (S11) a cover blank, removing (S12) a first mold, cutting (S13) a cover blank, arranging (S14) the cover blank in a second mold, forming (S15) a lens blank, and obtaining (S16) individual lenses, which are performed in this order. With the method of manufacturing described above, a lens 1E yielding a reduction of leaking light can be produced.

The method of manufacturing the lens 1E is similar to the method of manufacturing the lens 1D according to the fifth embodiment, except that in the obtaining (S16) individual lenses, the lens blank 10D is cut along the center of the light-shielding part 3E between the outer lateral surfaces 22a of adjacent connection parts 22 to obtain individual lenses 1E each having the outer lateral surfaces 22a of the side walls constituted by the connection part 22 covered by the light-shielding part 3E, and absence of a flange part.

Method of Manufacturing Light Emitting Device

Next, a method manufacturing a light emitting device 100E will be described.

The method of manufacturing the light emitting device 100E includes providing a lens and disposing the lens with respect to the light emitting element that has been positioned, which are performed in this order. The method of manufacturing the light emitting device 100E can be performed in a similar manner as in the method of manufacturing the light emitting device 100 according to the first embodiment, except for using the lens 1E.

Seventh Embodiment

Figure 21:
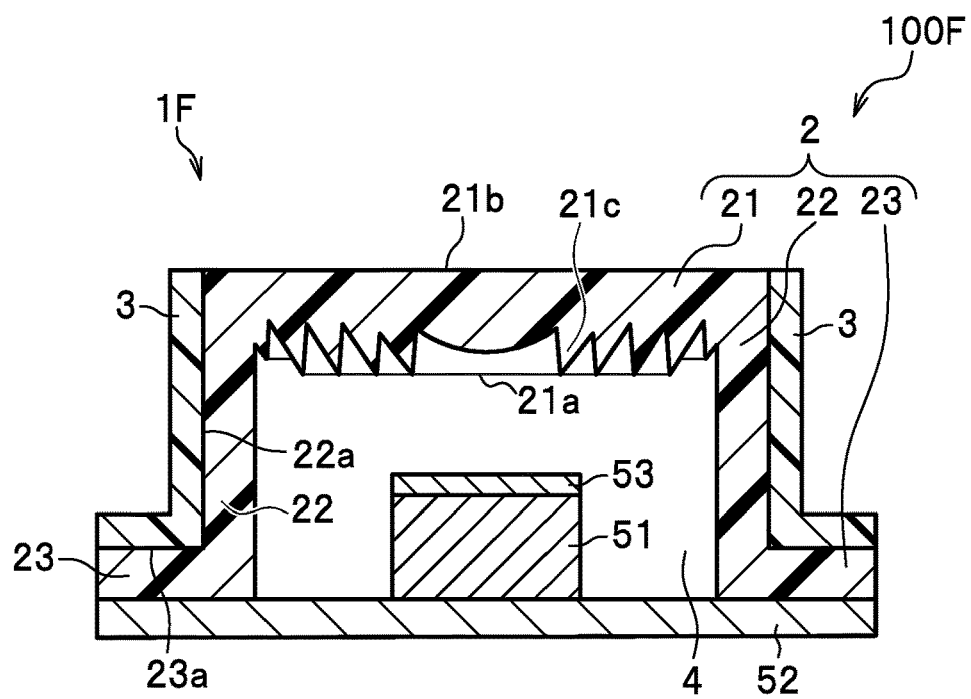
FIG. 21 is a cross-sectional view schematically showing a structure of a light emitting device that includes a lens according to a seventh embodiment, taken along a line passing through the center of the light emitting device.

As shown in FIG. 21, a plano-convex Fresnel lens having a plurality of projections 21c on either outer surface or inner surface (in FIG. 21, the lithe incidence surface 21a) may be used in the lens part 21 of the lens 1F and the light emitting device 100F. It is preferable that the lens part 21 has a light incidence surface 21a with a plurality of projections 21c, and a flat or substantially flat light-emitting surface 21b) such that the light-emitting surface 21b of the lens part 21 can be disposed in parallel to the light emitting surface of the light emitting element 51. The light-emitting surface 21b may have microscopic projections lower than the projections 21c, and formed by emboss processing, mat processing, or the like. With this, light emitted from the light-emitting surface 21b can be uniformly dispersed. FIG. 21 is a cross-sectional view schematically showing a structure of a light emitting device that includes a lens according to a seventh embodiment, taken along a line passing through the center of the light emitting device. Also, when a compound eye lens is used, a structure having the plurality of projections 21c either in the outward surface or the inward surface may be employed. As in the lens 1F and the light emitting device 100F, employing a structure having a plurality of projections 21c only in one surface (in this case the inward surface) of the lens part 21 allows for a reduction in a dimension in height direction, because the outward surface does not have the plurality of projections 21c.

Eighth Embodiment

Figure 22:
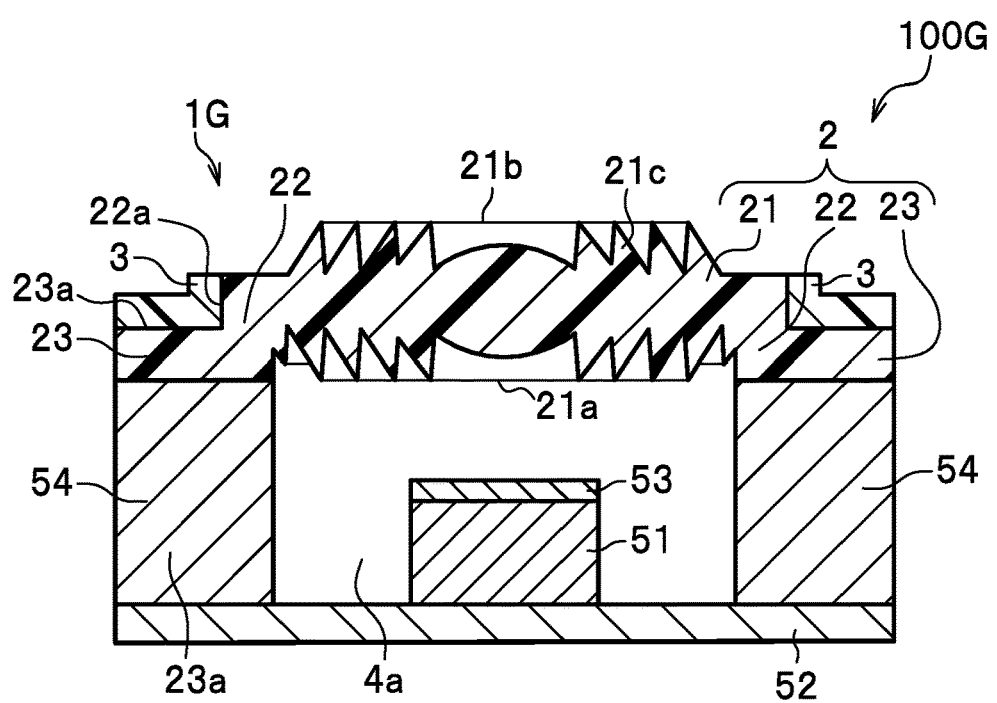
FIG. 22 is a cross-sectional view schematically showing a structure of a light emitting device that includes a lens according to an eighth embodiment, taken along a line passing through the center of the light emitting device.

As shown in FIG. 22, a lens 1G may have a structure in which a connection part 22 is formed at a lateral side of the lens part 21 and a flange part 23 is formed downward from the connection part 22. A light emitting device 100G according to an eighth embodiment may have a structure in which the lens 1G and a substrate 52 having a light emitting element 51 mounted thereon are bonded through an interposing member 54 which is formed of a light-reflecting material and disposed on the substrate 52. FIG. 22 is a cross-sectional view schematically showing a structure of a light emitting device that includes a lens according to the eighth embodiment, taken along a line passing through the center of the light emitting device.

In the lens 1G, outer lateral sides of the connection part 22 and upper surfaces of the flange part 23 are covered by a light-shielding part 3. In the lens 1G and the light emitting device 100G, a recess 4a is defined by the lens part 21, a portion of the connection part 22, and the interposing member 54.

In the case of the lens 1G, the lower surface of the flange part 23 is bonded to the substrate 52 through the interposing member 54 such that the lens part 21 is located facing the light emitting element 51 mounted on the substrate 52.

In the light emitting device 100G, the height of the interposing layer 54 is determined such that the light emitting element 51 mounted on the substrate 52 is spaced apart from the lens part 21 of the lens 1G.

In the lens 1G and the light emitting device 100G, the outer lateral surfaces of the flange part 23 and the outer lateral surfaces of the interposing member 54 may also be covered by the light-shielding part 3.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting device comprising:
a light emitting element; and
a lens comprising a cover part and a light-shielding part, wherein
the cover part comprises:
a lens part having a plurality of lateral sides;
a connection part constituting a plurality of lateral side walls each extending downward from a respective one of the plurality of lateral sides of the lens part; and
a plurality of flange parts each extending outward from a lower-end portion of a corresponding one of the plurality of lateral side walls,
the lens part and the connection part define a recess having an opening facing downward,
the lens part defines a bottom surface of the recess,
the plurality of lateral side walls define lateral surfaces of the recess, which define the opening of the recess,
the recess is formed inward of the plurality of flange parts,
the lens part, the plurality of flange parts, and the connection part are formed of a thermosetting first resin and continuous to one another,
the light-shielding part covers a plurality of lateral end surfaces and an upper surface of each of the plurality of flange parts, and the light-shielding part is disposed in contact with and around a perimeter of outer lateral surfaces of the plurality of lateral side walls, the light-shielding part is a one-piece member,
the light-shielding part is formed of a thermosetting second resin having a greater light-absorptance or a greater light-reflectance than the thermosetting first resin,
the lens part is disposed at a location allowing light from the light emitting element to be transmitted through the lens part,
the light emitting element is spaced apart from the lens part and the connection part such that an air gap is present between the light emitting element and both the lens part and the connection part, and
a distance between the bottom surface of the recess and an upper surface of the light emitting element is smaller than a distance between the connection part and side surfaces of the light emitting element.

2. The light emitting device according to claim 1, further comprising a substrate having the light emitting element mounted thereon, wherein the lens is disposed on the substrate with the plurality of flange parts connected to the substrate such that the lens part faces the light emitting element.

3. The light emitting device according to claim 1,
wherein the lens part includes a light incidence surface where light emitted from the light emitting element enters, and a light emitting surface at an opposite side to the light incidence surface where the light is emitted to the outside of the lens, and
wherein the lens part is composed entirely of the thermosetting first resin.

4. The light emitting device according to claim 1,
wherein the lens part is a Fresnel lens.

5. The light emitting device according to claim 1,
wherein the outer lateral surfaces are covered by the light-shielding part such that light from a singular light emitting element of the light emitting element is absorbed or reflected by the light-shielding part.

6. The light emitting device according to claim 1,
wherein the plurality of lateral side walls of the connection part extend about an entire perimeter of the lens part.

7. The light emitting device according to claim 1,
wherein the lens part includes a light emitting surface where the light is emitted to the outside of the lens, and
wherein the plurality of lateral side walls of the connection part extend about an entire perimeter of the light emitting surface of the lens part.

8. A light emitting device comprising:
a light emitting element; and
a lens comprising a cover part and a light-shielding part, wherein
the cover part comprises:
  a lens part having a plurality of lateral sides;
  a connection part constituting a plurality of lateral side walls each extending downward from a respective one of the plurality of lateral sides of the lens part; and
  a plurality of flange parts extending outward from a lower-end portion of a corresponding one of the plurality of lateral side walls,
the lens part and the connection part define a recess having an opening facing downward,
the lens part defines a bottom surface of the recess,
the lens part, the plurality of flange parts, and the connection part are formed of a thermosetting first resin and continuous to one another,
the plurality of flange parts each have a thickness in a range of 5 μm to 30 μm,
the light-shielding part covers a plurality of lateral end surfaces and an upper surface of each of the plurality of flange parts, and the light-shielding part is disposed in contact with and around a perimeter of outer lateral surfaces of the plurality of lateral side walls, the light-shielding part is a one-piece member,
the light-shielding part is formed of a thermosetting second resin having a greater light-absorptance or a greater light-reflectance than the thermosetting first resin,
the lens part is disposed at a location allowing light from the light emitting element to be transmitted through the lens part,
the light emitting element is spaced apart from the lens part and the connection part such that an air gap is present between the light emitting element and both the lens part and the connection part, and
a distance between the bottom surface of the recess and an upper surface of the light emitting element is smaller than a distance between the connection part and side surfaces of the light emitting element.

9. The light emitting device according to claim 8,
wherein the lens part includes a light incidence surface where light emitted from the light emitting element enters, and a light emitting surface at an opposite side to the light incidence surface where the light is emitted to the outside of the lens, and
wherein the lens part is composed entirely of the thermosetting first resin.

10. The light emitting device according to claim 8,
wherein the lens part is a Fresnel lens.

11. The light emitting device according to claim 8,
wherein the outer lateral surfaces are covered by the light-shielding part such that light from a singular light emitting element of the light emitting element is absorbed or reflected by the light-shielding part.

12. The light emitting device according to claim 8,
wherein the plurality of lateral side walls of the connection part extend about an entire perimeter of the lens part.

13. The light emitting device according to claim 8,
wherein the lens part includes a light emitting surface where the light is emitted to the outside of the lens, and
wherein the plurality of lateral side walls of the connection part extend about an entire perimeter of the light emitting surface of the lens part.

14. A light emitting device comprising:
a light emitting element; and
a lens comprising a cover part and a light-shielding part, wherein
the cover part comprises:
  a lens part having a plurality of lateral sides; and
  a connection part constituting a plurality of lateral side walls each extending downward from a respective one of the plurality of lateral sides of the lens part,
the lens part and the connection part define a recess having an opening facing downward,
the lens part defines a bottom surface of the recess,
the plurality of lateral side walls define lateral surfaces of the recess, which define the opening of the recess,
the lens part and the connection part are formed of a thermosetting first resin and continuous to each other,
the light-shielding part is disposed in contact with and around a perimeter of outer lateral surfaces of the plurality of lateral side walls, the light-shielding part is a one-piece member, and the light-shielding part is formed of a thermosetting second resin having a greater light-absorptance or a greater light-reflectance than the thermosetting first resin,
the lens part is disposed at a location allowing light from the light emitting element to be transmitted through the lens part,
the light emitting element is spaced apart from the lens part and the connection part such that an air gap is present between the light emitting element and both the lens part and the connection part, and
a distance between the bottom surface of the recess and an upper surface of the light emitting element is smaller than a distance between the connection part and side surfaces of the light emitting element.

15. The light emitting device according to claim 14,
further comprising a substrate having the light emitting element mounted thereon, and the connection part is disposed on the substrate such that the lens part faces the light emitting element.

16. The light emitting device according to claim 14,
wherein the lens part includes a light incidence surface where light emitted from the light emitting element enters, and a light emitting surface at an opposite side to the light incidence surface where the light is emitted to the outside of the lens, and
wherein the lens part is composed entirely of the thermosetting first resin.

17. The light emitting device according to claim 14,
wherein the lens part is a Fresnel lens.

18. The light emitting device according to claim 14,
wherein the outer lateral surfaces are covered by the light-shielding part such that light from a singular light emitting element of the light emitting element is absorbed or reflected by the light-shielding part.

19. The light emitting device according to claim 14, wherein the plurality of lateral side walls of the connection part extend about an entire perimeter of the lens part.

20. The light emitting device according to claim 14, wherein the lens part includes a light emitting surface where the light is emitted to the outside of the lens, and wherein the plurality of lateral side walls of the connection part extend about an entire perimeter of the light emitting surface of the lens part.

* * * * *